United States Patent
Bobde et al.

(10) Patent No.: US 8,946,816 B2
(45) Date of Patent: Feb. 3, 2015

(54) HIGH FREQUENCY SWITCHING MOSFETS WITH LOW OUTPUT CAPACITANCE USING A DEPLETABLE P-SHIELD

(71) Applicant: Alpha and Omega Semiconductor Incorporated, Sunnyvale, CA (US)

(72) Inventors: Madhur Bobde, Sunnyvale, CA (US); Hamza Yilmaz, Saratoga, CA (US); Sik Lui, Sunnyvale, CA (US); Daniel Ng, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/270,228

(22) Filed: May 5, 2014

(65) Prior Publication Data

US 2014/0239382 A1    Aug. 28, 2014

Related U.S. Application Data

(62) Division of application No. 13/724,093, filed on Dec. 21, 2012, now Pat. No. 8,753,935.

(51) Int. Cl.
*H01L 29/76* (2006.01)
*H01L 29/78* (2006.01)
(Continued)

(52) U.S. Cl.
CPC .......... *H01L 29/7813* (2013.01); *H01L 27/04* (2013.01); *H01L 29/66719* (2013.01); *H01L 29/66727* (2013.01); *H01L 29/66734* (2013.01); *H01L 29/7806* (2013.01); *H01L 29/7808* (2013.01); *H01L 29/7811* (2013.01); *H01L 29/0623* (2013.01); *H01L 29/0634* (2013.01);
(Continued)

(58) Field of Classification Search
CPC ............... H01L 29/7813; H01L 21/28061; H01L 29/407; H01L 29/4236
USPC ............ 257/334, E29.26, E29.263; 438/270, 438/272
See application file for complete search history.

(56) References Cited

U.S. PATENT DOCUMENTS 4,941,026 A    7/1990    Temple
5,998,833 A    12/1999    Baliga
(Continued)

OTHER PUBLICATIONS

Notice of Allowance for U.S. Appl. No. 13/724,180, dated Jun. 4, 2014.

(Continued)

*Primary Examiner* — Tu-Tu Ho
(74) *Attorney, Agent, or Firm* — Joshua D. Isenberg; JDI Patent

(57) ABSTRACT

Aspects of the present disclosure describe a high density trench-based power MOSFETs with self-aligned source contacts and methods for making such devices. The source contacts are self-aligned with spacers and the active devices may have a two-step gate oxide. A lower portion may have a thickness that is larger than the thickness of an upper portion of the gate oxide. The MOSFETS also may include a depletable shield in a lower portion of the substrate. The depletable shield may be configured such that during a high drain bias the shield substantially depletes. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

14 Claims, 23 Drawing Sheets

(51) Int. Cl.
- H01L 27/04 (2006.01)
- H01L 29/66 (2006.01)
- H01L 29/06 (2006.01)
- H01L 29/10 (2006.01)
- H01L 21/225 (2006.01)
- H01L 29/417 (2006.01)
- H01L 29/423 (2006.01)
- H01L 29/45 (2006.01)

(52) U.S. Cl.
CPC ......... *H01L 29/1095* (2013.01); *H01L 21/2257* (2013.01); *H01L 29/41766* (2013.01); *H01L 29/42368* (2013.01); *H01L 29/4238* (2013.01); *H01L 29/456* (2013.01); *H01L 29/0696* (2013.01)
USPC .............. 257/334; 257/E29.26; 257/E29.263; 438/270; 438/272

(56) References Cited

U.S. PATENT DOCUMENTS

| | | | |
|---|---|---|---|
| 6,251,730 | B1 | 6/2001 | Luo |
| 7,109,552 | B2 | 9/2006 | Wu |
| 7,361,557 | B2 | 4/2008 | Inagawa et al. |
| 7,691,706 | B2 | 4/2010 | Kim |
| 7,910,439 | B2 | 3/2011 | Darwish et al. |
| 8,252,647 | B2 | 8/2012 | Lee et al. |
| 8,466,513 | B2 | 6/2013 | Grivna et al. |
| 8,575,695 | B2 | 11/2013 | Bobde et al. |
| 8,664,065 | B2 * | 3/2014 | Grivna .......................... 438/270 |
| 8,710,582 | B2 | 4/2014 | Okumura et al. |
| 8,753,935 | B1 | 6/2014 | Bobde et al. |
| 2003/0127702 | A1 | 7/2003 | Blair et al. |
| 2004/0014451 | A1 | 1/2004 | Sapp et al. |
| 2005/0062124 | A1 | 3/2005 | Chiola |
| 2005/0161758 | A1 | 7/2005 | Chiola |
| 2008/0283956 | A1 | 11/2008 | Hshieh et al. |
| 2009/0008706 | A1 | 1/2009 | Yedinak et al. |
| 2009/0224312 | A1 | 9/2009 | Taketani |
| 2009/0315083 | A1 | 12/2009 | Pan et al. |
| 2010/0187642 | A1 | 7/2010 | Grivna |
| 2011/0177662 | A1 | 7/2011 | Yilmaz et al. |
| 2011/0177663 | A1 | 7/2011 | Kachi |
| 2011/0284955 | A1 | 11/2011 | Sapp et al. |
| 2012/0220091 | A1 | 8/2012 | Challa et al. |
| 2012/0276701 | A1 | 11/2012 | Yedinak et al. |
| 2012/0292693 | A1 | 11/2012 | Lee et al. |
| 2013/0248995 | A1 | 9/2013 | Nishiwaki et al. |
| 2014/0048846 | A1 | 2/2014 | Lui et al. |
| 2014/0170823 | A1 | 6/2014 | Lin |
| 2014/0175536 | A1 | 6/2014 | Lee et al. |
| 2014/0339630 | A1 | 11/2014 | Yilmaz et al. |

OTHER PUBLICATIONS

U.S. Appl. No. 13/724,180, to Hamza Yilmaz, filed Dec. 21, 2012.
U.S. Appl. No. 14/329,806, to Hamza Yilmaz, filed Jul. 11, 2014.
Non-Final Office Action for U.S. Appl. No. 13/776,523, dated Sep. 25, 2014.
Notice of Allowance for U.S. Appl. No. 13/724,228, dated Sep. 19, 2014.
Co-Pending U.S. Appl. No. 14/566,294, to Madhur Bobde, filed Dec. 10, 2014.

* cited by examiner

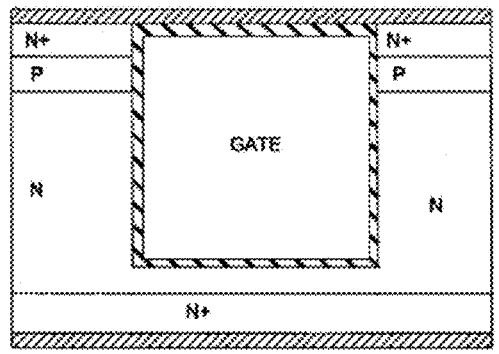
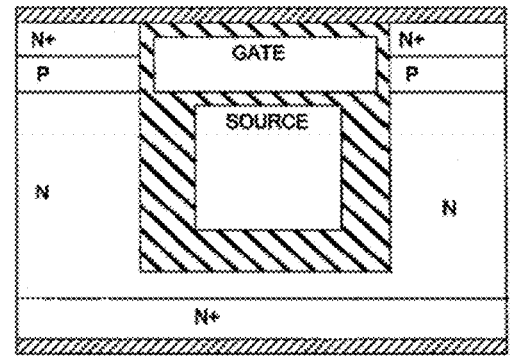
FIG. 1A (Prior Art)   FIG. 1B (Prior Art)
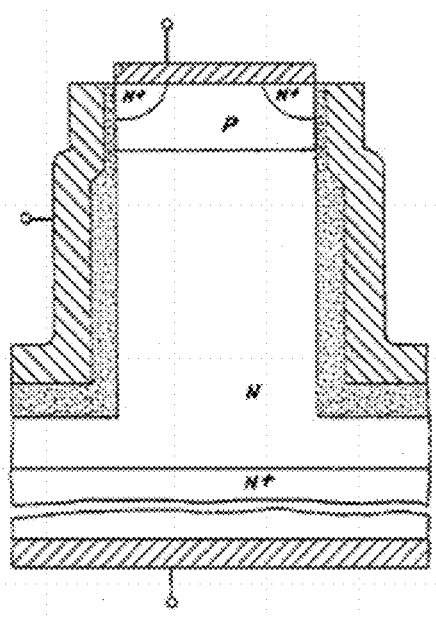
FIG. 1C (Prior Art)

HIGH FREQUENCY SWITCHING MOSFETS WITH LOW OUTPUT CAPACITANCE USING A DEPLETABLE P-SHIELD

CLAIM OF PRIORITY

This application is a divisional of commonly-assigned, co-pending application Ser. No. 13/724,093, filed on Dec. 21, 2012 and entitled "HIGH FREQUENCY SWITCHING MOSFETS WITH LOW OUTPUT CAPACITANCE USING A DEPLETABLE P-SHIELD" to Bobde, Yilmaz, Lui, Ng, the entire disclosures of which are incorporated herein by reference.

CROSS-REFERENCE TO RELATED APPLICATIONS

This application is related to commonly-assigned, co-pending application Ser. No. 13/724,228, filed on Dec. 21, 2012 and entitled "HIGH DENSITY TRENCH-BASED POWER MOSFETS WITH SELF-ALIGNED ACTIVE CONTACTS AND METHOD OF MAKING SUCH DEVICES" to Lee, Chang, Kim, Lui, Yilmaz, Bobde, Calafut, and Chen, the entire disclosures of which are incorporated herein by reference.

This application is related to commonly-assigned, co-pending application Ser. No. 13/724,180, on Dec. 21, 2012 and entitled "DEVICE STRUCTURE AND METHODS OF MAKING HIGH DENSITY MOSFETS FOR LOAD SWITCH AND DC-DC APPLICATIONS" to Yilmaz, Bobde, Chang, Lee, Calafut, Kim, Lui, and Chen, the entire disclosures of which are incorporated herein by reference.

FIELD OF THE INVENTION

This invention generally relates to metal oxide silicon field effect transistors (MOSFETs) and more particularly to high density trench based power MOSFETS.

BACKGROUND OF THE INVENTION

Low voltage power MOSFETs are often used in load switching applications. In load switching applications it is desirable to reduce the on-resistance ($R_{ds}$) of the device. Specifically, the $R_{ds}A$ of the device needs to be minimized, where $R_{ds}A$ is the on-resistance of the device multiplied by the active area of the device. Additionally, low voltage power MOSFETs are commonly used in high frequency DC-DC applications. In these applications it is often desirable to maximize the device's switching speed. Three of the most important parameters for optimizing the switching speed are: 1) $R_{ds} \times Q_g$; 2) $R_{ds} \times Q_{OSS}$; and 3) the ratio of $Q_{gd}/Q_{gs}$. First, the product of the $R_{ds}$ and the gate charge ($Q_g$) is a measure of the device conduction and switching losses together. $Q_g$ is the sum of the gate to drain charge ($Q_{gd}$) and the gate to source charge ($Q_{gs}$). In the second parameter, $Q_{OSS}$ is a measure of the capacitances that need to be charged and discharged whenever the device is switched on or off. Finally, minimizing the ratio of $Q_{gd}/Q_{gs}$ reduces the possibility of the device turning on due to a large dV/dt when the device is being switched off.

Trench based MOSFETs, as shown in FIG. 1A, were designed in part in order to reduce $R_{dsA}$ of the device. The design of trench based MOSFETs allowed for the removal of the JFET structure that was present in planar MOSFETs. By eliminating the JFET, the cell pitch could be reduced. However, the basic trench based MOSFET does not have any charge balancing in the drift regions, and therefore causes an increase in the $R_{ds}A$. Also, the relatively thin gate oxide generates a high electric field under the trench, which leads to a lower breakdown voltage. Low doping concentrations are needed in the drift region in order to support the voltage, and this increases the $R_{ds}A$ for structures with thinner gate oxides. Further, as cell pitch continues to decrease, the trench based MOSFET may become a less desirable choice because of the difficulty in reducing the thickness of the gate oxide further.

Previous attempts have been made to solve these problems through various designs. A first example is a shielded gate MOSFET as shown in FIG. 1B and described in U.S. Pat. No. 5,998,833 to Baliga. The use of a trench-based shield electrode connected to source potential instead of a larger gate electrode reduces the gate-to-drain capacitance ($C_{gd}$) of the MOSFET and improves switching speed by reducing the amount of gate charging and discharging needed during high frequency operation. However, the MOSFET device described by Baliga exhibits a high output capacitance because the source potential is capacitively coupled to the drain via the shield electrode. Also, in order to sustain the blocking voltage a thick oxide is required. Finally, complex processing is required in order to produce two electrically separated polysilicon electrodes within the same trench. The complexity of the fabrication is further accentuated when the pitch of the device is scaled downwards to the deep sub-micron level.

Finally, the MOSFET design shown in FIG. 1C and described in U.S. patent application No. 4,941,026 to Temple, has certain characteristics that may be utilized to optimize the switching characteristics of a device. The device in Temple utilizes a two-step gate oxide with a thin layer of oxide near the top of the gate and a thicker layer of oxide in the bottom portion of the gate in order to create a device that has a low channel resistance and a low drift resistance. The thin upper portion of the gate oxide provides good coupling between the gate and body region which generates a strong inversion and low on-resistance in a channel next to the thin upper portion. The thicker gate oxide on the bottom creates a charge balancing effect and allows for the drift region to have an increased doping concentration. A higher doping concentration in the drift region decreases its resistance.

However, the device shown in FIG. 1C is not easily downwards scalable because it is highly susceptible to body contact misalignment errors. For example, if the pitch of the devices was scaled to the deep sub-micron level e.g., 0.5-0.6 μm, then the contact mask misalignment, relative to the gate, may greatly alter the characteristics of the device. In order to provide a good ohmic contact to the body region, an ohmic contact that is highly doped with dopants of the same conductivity type as the body region may be implanted after the contact mask has been used. If the contact mask is aligned too close to the gate, namely not landing exactly at the center of the silicon mesa, then highly doped implants used to generate the ohmic contact with the body may end up in the channel. If the highly doped ohmic region is in the channel, then the threshold voltage and the on-resistance of the device will be impacted. Also, if the contact mask is aligned too far away from the gate, then the turn on of the bipolar junction transistor (BJT) becomes an issue. Since the contact is further from the trench, the length of the body region is increased and therefore so is its resistance. As the resistance of the body region increases, it increases the voltage drop across the body region. The larger voltage drop across the body region will make it easier for the parasitic BJT to turn on and ruin the device.

Therefore, in order to fabricate deep sub-micron devices that are optimized for use as load switches and high frequency DC-DC applications there is a need for a device and method capable of self-aligning the contacts to the gate in order to prevent the aforementioned side effects.

It is within this context that embodiments of the present invention arise.

BRIEF DESCRIPTION OF THE DRAWINGS

FIGS. 1A-1C are prior art MOSFET devices.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N-type device is described for purposes of illustration. P-type devices may be fabricated using a similar process but with opposite conductivity types.

Aspects of the present disclosure describe a high density trench-based power MOSFET with self-aligned source contacts. The source contacts may be self-aligned with conductive or semiconductor spacers. The spacers may be formed along the sidewall of the gate caps. Additionally, the active devices may have a two-step gate oxide, wherein a lower portion of the gate oxide has a thickness $T_2$ that is larger than the thickness $T_1$ of an upper portion of the gate oxide. The two-step gate oxide combined with the self-aligned source contacts allow for a highly scalable device that is capable of being produced with an active device pitch in the deep sub-micron level, e.g., 0.5-0.6 microns.

Additional aspects of the present disclosure describe a similar device that does not have a source region formed in the silicon epi part of the device. According to this aspect of the present disclosure, the semiconductor spacers, e.g., N⁺-doped polysilicon spacers, may also serve as the source region, and therefore the addition of a source region within the substrate may be omitted. Additional aspects of the present disclosure describe a similar device where the source region formed in the silicon epi part of the device is formed by diffusing dopants from the doped polysilicon spacers into the silicon epi part of the device.

Figure 2B:
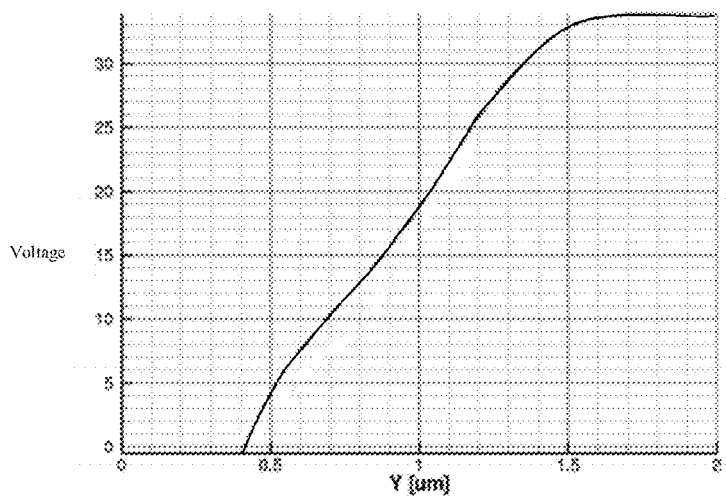
FIGS. 2A-2C are diagrams and a graph that explain the electrical characteristics of the MOSFET devices according to aspects of the present disclosure.
Figure 2A:
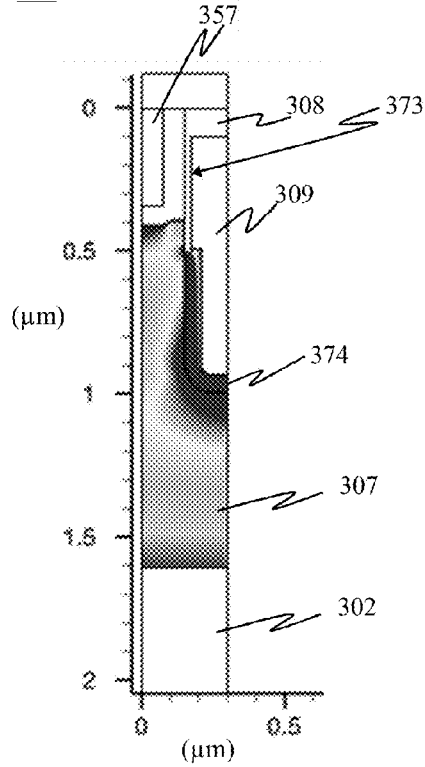

The two step gate oxide allows for a significant portion of the voltage to be supported by a lower portion of the gate oxide 374. This reduces the amount of voltage that the epitaxial layer 307 must support. FIG. 2A is a cross sectional view of an active device that displays the strength of the electric field, where darker shading indicates a higher electric field strength. As shown by the heavy shading along the bottom portion of the trench, the lower portion of the gate oxide 374 supports a large portion of the electric field. FIG. 2B is a graph depicting voltage that has been blocked by device 300 versus the depth into the substrate. Device 300 begins blocking voltage at a depth of approximately 0.5 microns. This depth is consistent with the depth at which the lower portion of the gate oxide 374 with a thickness $T_2$ begins. Near the bottom of the trench and the oxide 374 (about 1.0 microns) the device has blocked a total of approximately 18 volts. This greatly reduces the voltage blocking burden of the epitaxial layer 307. Therefore, the doping concentration of epitaxial drift layer 307 may be increased in order to reduce the $R_{ds}A$ of device. The increase in the doping concentration of the epitaxial layer 307 along with lower channel resistance due to smaller cell pitch allows for an approximately 90% or more decrease in the $R_{dsA}$ when compared to the prior art trench based MOSFET designed to support the same voltage described in FIG. 1A, or an approximately 37% or more decrease in the $R_{dsA}$ when compared to the prior art split gate MOSFET designed to support the same voltage described in FIG. 1B.

Figure 2C:
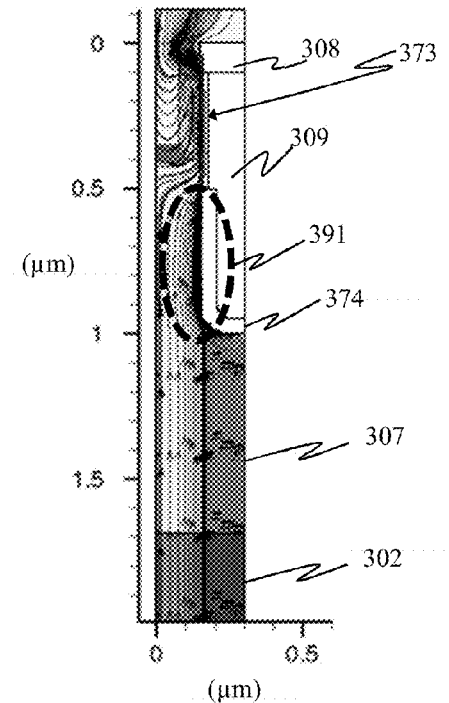

The $R_{ds}A$ of the device is further decreased because of the location of the accumulation region 391. As shown in FIG. 2C, when the gate is turned on a narrow accumulation region 391 is formed in the upper portion of the epitaxial layer 307 adjacent to the trench sidewall. By way of example, the accumulation region 391 may be approximately 300-400 Å wide. This concentration of charge carriers along the accumulation region reduces the resistance over the upper portion of the epitaxial layer 307. Further, since the accumulation region 391 is thin, reducing the cell pitch does not affect the resistance as long as the pitch is greater than the width of the accumulation region 391. This feature is not present in a split gate MOSFET device of the type described above with respect to FIG. 1B. In that type of device, the lower portion of the trench is kept at the source potential, which prevents an accumulation region 391 from forming along a narrow path proximate to the sidewall. Therefore, it is not practical to shrink the pitch of the split gate MOSFET to the deep sub-micron level.

The switching speed of the device may also be improved because the gate to drain coupling of the device is reduced by the addition of a depletable P-shield 344 that is electrically connected to a source metal 317 via a connection to the P-body layer 303. A non-depletable structure for reducing the gate to drain coupling, such as in a split-gate device, achieves a decrease in gate to drain coupling at the cost of a large increase in the output capacitance of the device. However, reducing the gate to drain coupling with a depletable P-shield 344 produces a much less significant increase in output capacitance. This effect is produced because at low drain biases the P-shield 344 couples with the gate electrode 309 much like a typical split-gate device, which reduces gate to drain coupling. Unlike a typical split-gate device, however, when the drain experiences a high bias, the P-shield 344 depletes. This produces a charge balanced region for the N-doped epitaxial layer 307. The fully depleted epitaxial layer 307 decreases the output capacitance of the device by increasing the dielectric width.

Figure 3A:
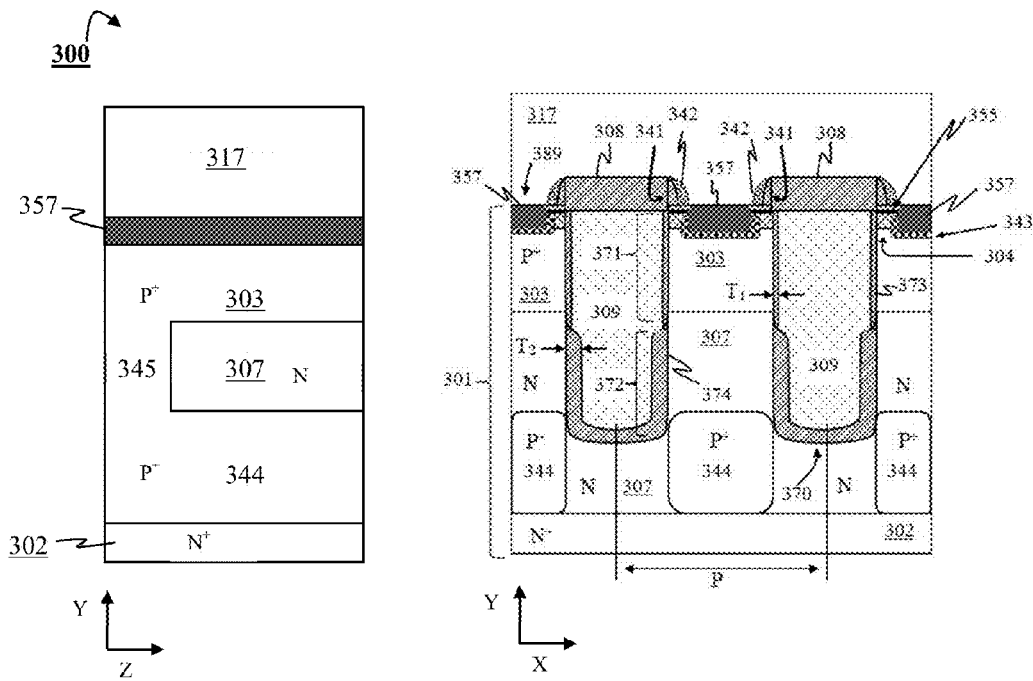
FIGS. 3A-3F are cross-sectional diagrams of several MOSFET devices according to aspects of the present disclosure.

FIG. 3A is a combination of two cross-sectional views of a device structure 300 according to aspects of the present disclosure. The cross-sectional view on the right is a view of the primary plane of the MOSFET device 300, and the cross-sectional view on the left is a view of the secondary plane of the MOSFET device. The primary plane and the secondary plane are orthogonal to each other, with the primary plane being designated as the X-Y plane, and the secondary plane being designated as the Z-Y plane. As such, the secondary plane allows for a view of a third dimension hidden in the primary plane. The device structure 300 may be built on a semiconductor substrate 301. The substrate 301 may be suitably doped to be an N-type or a P-type substrate. As used herein, the substrate 301 will be described as an N-type substrate. The semiconductor substrate 301 may have a heavily doped N$^+$ drain region 302. Above the drain region 302 may be a lightly doped N-type epitaxial layer 307. A suitably doped P-body layer 303 may be formed in a top portion of the epitaxial layer 307. An N$^+$-doped source region 304 may be formed in a top portion of the body layer 303. However, source region 304 may optionally be omitted because the N$^+$-doped polysilicon spacers 342 may also serve as the source region due to their high concentration of N-type dopants.

According to aspects of the present disclosure, the active area of the device structure 300 may comprise a plurality of trench based power MOSFETs. The trench based power MOSFETs are formed by creating a trench 370 that extends through the P-body region 303 and into the epitaxial layer 307. Each trench may have an upper portion 371 and a lower portion 372. The upper portion of the trench 371 may be lined with an upper insulative layer 373 that has a thickness $T_1$, and the lower portion of the trench 372 may be lined with a lower insulative layer 374 that has a thickness $T_2$. According to aspects of the present disclosure, it is desirable that the thickness $T_1$ be smaller than the thickness $T_2$. By way of example, the upper and lower insulative layers may be an oxide. The remainder of the trench may be filled with a suitable material to form a gate electrode 309. By way of example, the gate electrode 309 may be formed with polysilicon. Though not shown in FIG. 3A, gate electrodes 309 are connected to a gate pad and are maintained at a gate potential. Each gate electrodes 309 is electrically isolated from a source material 317 by an insulative gate cap 308 which is disposed above the trench. An insulative layer 355 may also be formed above the source region 304. The possibility of short circuiting the gate electrode 309 to the source material 317 may be reduced by forming an insulative spacer 341 along the vertical edges of the gate caps 308. By way of example, the insulative spacer 341 may be an oxide. In practice, a thin gate oxide insulation between the gate poly and source metal might not be sufficient if a self-aligned contact dry etch further thins down the oxide at the corner and causes increased leakage.

One or more heavily doped depletable P-shields 344 may be formed at a depth below the trenches 370. As used herein a depth below the trenches 370 includes locations directly under the trenches, and locations offset from the trenches. Additionally, top portion of the P-shields 344 may extend above the bottom surface of the trenches 370. The doping concentration chosen for the P-shields 344 should allow for the P-shields 344 to substantially deplete when the drain bias is approximately fifty percent of the maximum drain to source voltage. By way of example, and not by way of limitation, the P-shields 344 may have a doping concentration that ranges from $5 \times 10^{15}$ cm$^{-3}$-$5 \times 10^{16}$ cm$^{-3}$. The P-shields 344 may extend down to the drain contact 302 or they may end before reaching the drain contact 302. P-shields 344 may be in electrical connection with the source metal 317 via a connection to the P-body layer 303. In FIG. 3A the connection is visible in the cross-sectional view of the secondary plane. The depletable P-shield 344 may extend in the Z-direction until it reaches a P-connector region 345. The P-connecter region 345 is a region that is doped with P-type dopants, and provides a connection between the P-body layer 303 and the depletable P-shield 344. The P-connector 344 may be considered a part of the P-shield since it too will substantially deplete at high drain biases.

Figure 3B:
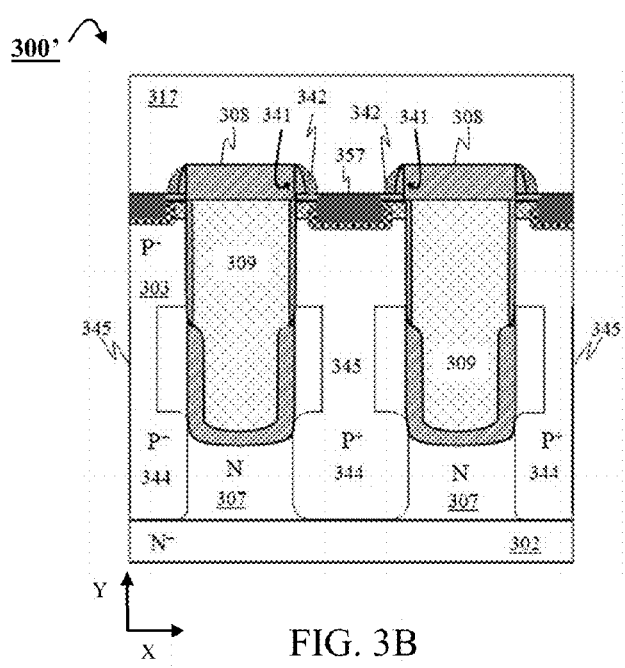

According to an additional aspect of the present disclosure, a device structure 300' may also make the P-connection 345 between the depletable P-shield 344 and the P-body 303 in the primary plane of the MOSFET device 300'. FIG. 3B depicts a structure 300' that is substantially similar to device 300 in FIG. 3A, but with the depletable P-shields having P-connections 345 in the X-Y plane that connect the P-body 303 and the depletable P-regions 344. While the P-connections 345 extend between the trenches 370, there are still portions of the N-epitaxial layer 307 proximate to the sidewalls of the trenches 370.

Figure 3C:
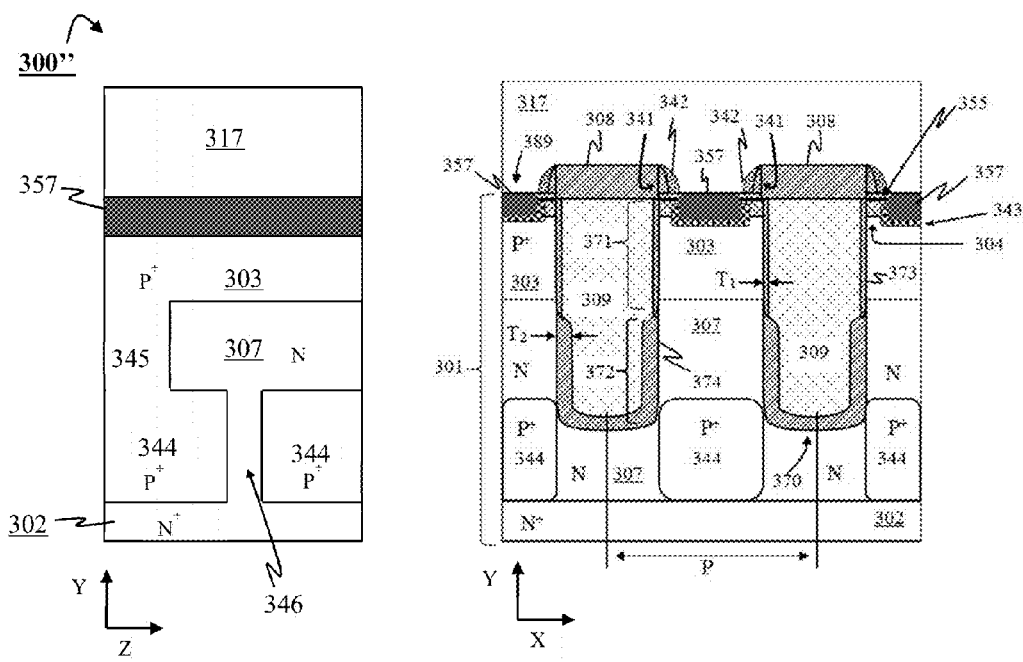

FIG. 3C depicts a device 300'' according to yet another additional aspect of the present disclosure. Device 300'' includes an N-connection 346 that connects the epitaxial layer 307 to the drain contact 302. Device 300'' looks similar to device 300 when viewed from the primary plane. However, the N-connection 346 can be seen extending through the P-shield 344 when viewed from the secondary plane. Connecting the epitaxial layer 307 to the drain contact prevents the device from having floating regions in the device active area that may affect device characteristics such as Rds.on during switching.

Figure 3D:
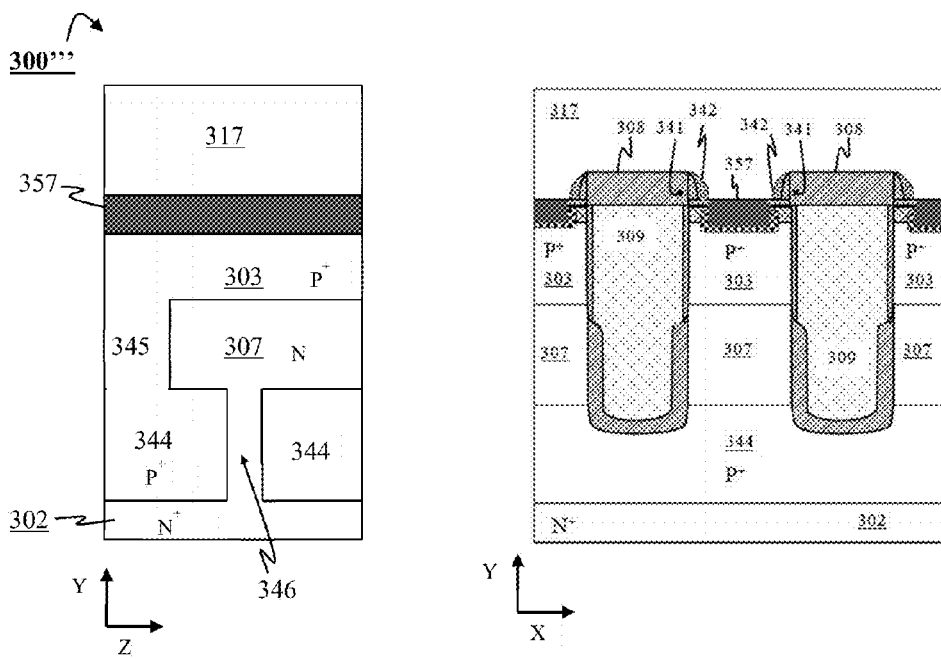

FIG. 3D depicts a device 300''' according to yet another additional aspect of the present disclosure. Device 300''' utilizes an orthogonal super-junction structure. A super-junction structure typically includes alternating P-type and N-type doped columns formed in the epitaxial layer of a device. In the OFF-state of the MOSFET, the columns completely deplete at relatively low voltage and thus can sustain a relatively high breakdown voltage. As shown in the primary plane, the P-shield 344 extends uninterrupted in the X-direction below the trenches 370. Again, it should be noted that a top portion of the P-shield 344 may extend above the bottom surface of the trenches 370. The alternating columns of N-type and P-type material are formed in the Z-direction. Looking at the secondary plane, the N-connection 346 serves as the N-type doped column for the super-junction device. Portions of the P-shield are connected to the P-body 303 with a P-connection 345. Portions of the P-shield 344 shown in the X-Y plane may be connected to a deep P-Tub 361 (not shown).

Returning to FIG. 3A, the source regions 304 are electrically connected to the source electrode 317 through self-aligned contact openings 389 in the substrate that extend through the insulating layer 305 and the source region 304. The openings 389 are self-aligned by the N$^+$-doped polysilicon spacers 342 formed along the exposed sidewall of the insulative spacers 341. These spacers function as a mask layer for an etching process used to form the contact openings 389. The N$^+$-doped polysilicon spacers 342 reduce the contact resistance by increasing the area of contact to the source and allow for the formations of an ohmic contact. By way of example and not by way of limitation, the electrical connections may be made with conductive plugs 357. By way of example and not by way of limitation, the conductive plugs 357 may be made from a conductive material such as tungsten. An ohmic contact between the conductive plugs 357 and the P-body layer 303 may be improved by the addition of an ohmic contact region 343. The ohmic contact region 343 is a highly doped P-region that is formed on the exposed surface of the self-aligned contact openings 389. By way of example, the ohmic contact region 343 may by formed by implanting P-type dopants such as boron with a doping concentration of approximately $10^{19}$ cm$^{-3}$.

The self-aligned contact openings 389 may be formed sufficiently close to each other such that the active devices in the MOSFET device have a pitch P of less than 1.0 microns. More specifically, aspects of the present disclosure allow for the devices to have a pitch P of less than 0.6 microns. This pitch is made possible in because the self-alignment of the contact openings 389 eliminates alignment errors even when the devices are scaled to have a pitch below 1.0 micron. This ensures that threshold voltage of the device is maintained, because the dopants from the ohmic contact region 343 remain outside of the channel. Additionally, the self-alignment of the contact openings 389 allows for precise control of the parasitic BJT turn on because the distance between the trench sidewall and the conductive plug will be substantially constant across the device. Consistent spacing makes the resistance of the body region and the voltage drop across the body region substantially constant across the device as well. Therefore, there will be little variation in the conditions that will cause the parasitic BJT to turn on for each active device.

Figure 3E:
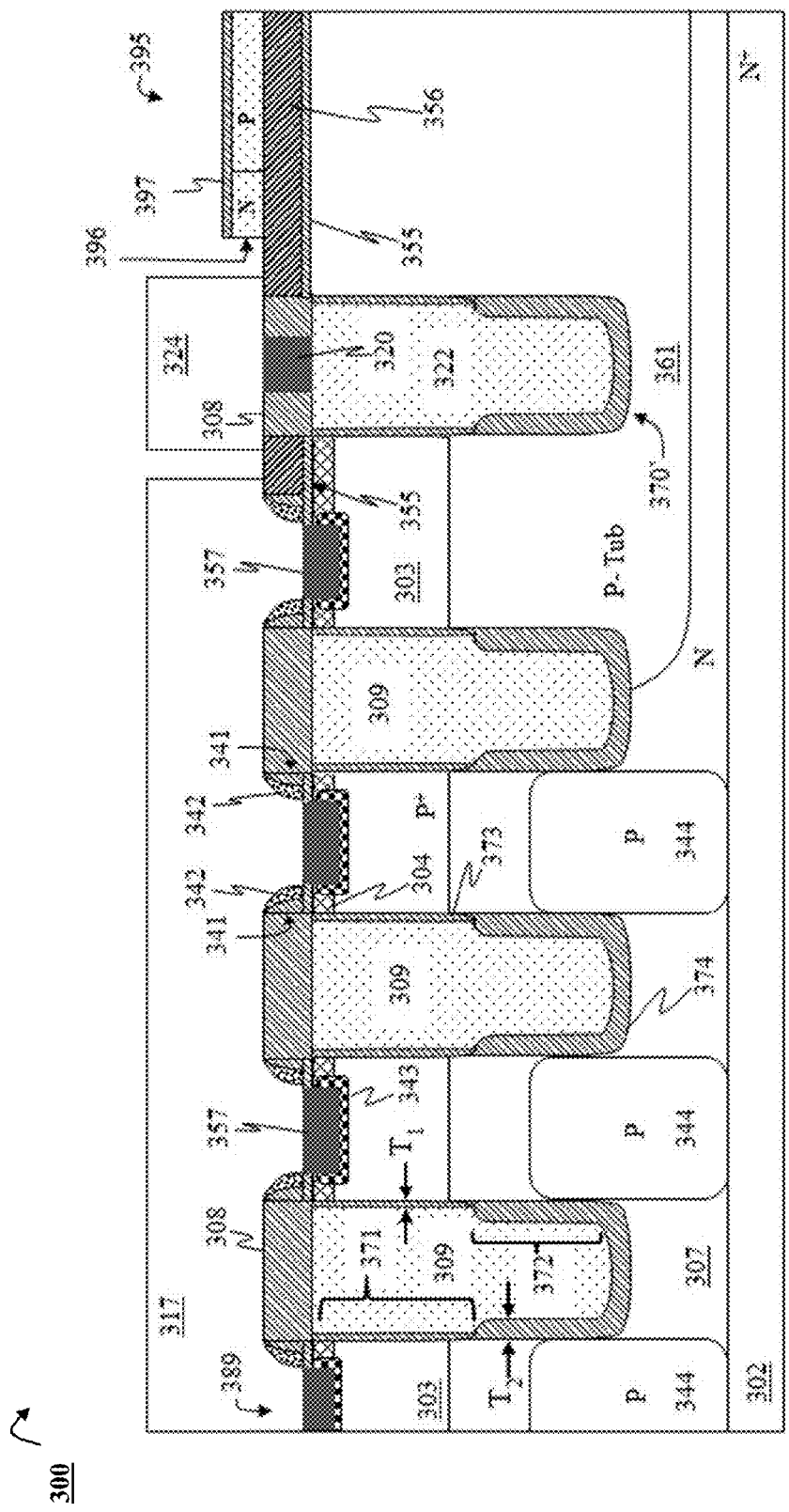

Device 300 may optionally include an electrostatic discharge (ESD) protection structure 395 as shown in FIG. 3E. The ESD protection structure 395 may be a conductive material 396 formed over a first layer 356 of a two layer hardmask. The conductive material 396 may be selectively doped to include N-type and P-type regions. An insulative layer 397 may be formed over a top surface of the conductive material 396.

Device 300 may also optionally include one or more gate pickup trenches 370' as shown in FIG. 3E. The gate pickup trench 370' is substantially similar to the active device trenches 370. However, instead of an electrically insulated gate electrode 309, the gate pickup electrode 322 is electrically connected to a gate metal 324 with an electrical connection 320 that extends through the gate cap 308. By way of example, and not by way of limitation, the electrical connection 320 may be tungsten. The gate pickup trench may be formed in a deep doped region 361 that is doped with opposite-type dopants to the substrate. By way of example, and not by way of limitation, if the substrate 301 is N-type, the deep doped region 361 would be doped P-type, in which case it is sometimes referred to as a "P-Tub". Alternatively, if the substrate 301 us P-type, the deep doped region 361 would be doped N-type, in which case it is sometimes referred to as an "N-Tub".

Figure 3F:
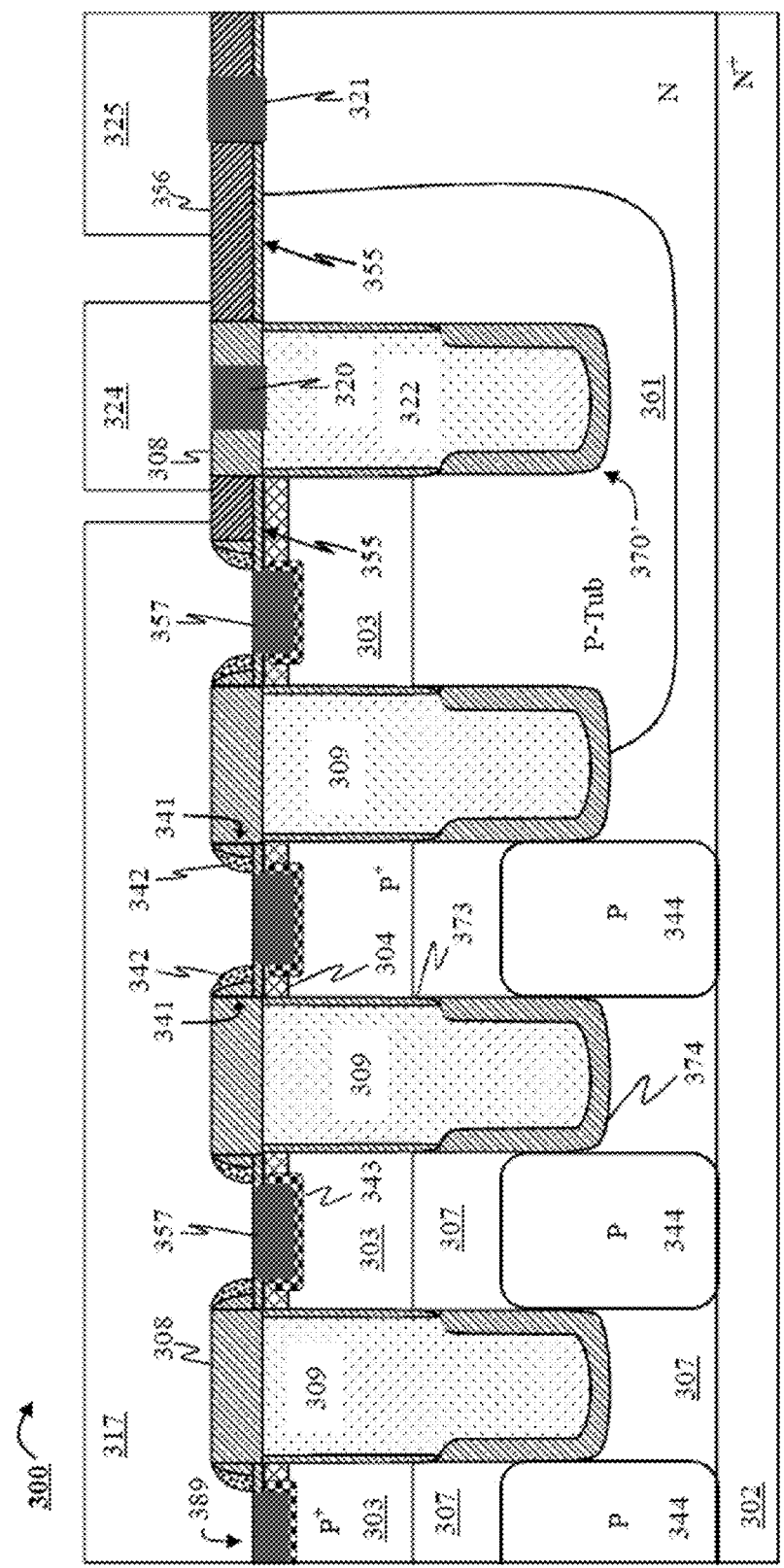

FIG. 3F depicts a device 300 that may also optionally include one or more Schottky contacts configured to terminate the electric field. The Schottky contacts in combination with the P-tub 361 may also function as a body clamp (BCL) configured to prevent the active devices from operating above their breakdown voltages. As shown in FIG. 3F, the Schottky contact may include a metal contact 321 that electrically connects a Schottky metal 325 to the semiconductor substrate 301 outside the P-tub 361. By way of example, the contact 320 may extend through a hardmask having a first layer 356 and a second layer 355. By way of example, and not by way of limitation, the first layer may be a nitride layer and the second layer may be an oxide layer. By way of example, and not by way of limitation, the metal contacts 321 may be tungsten. The Schottky metal 325 may be formed over the metal contacts 321 and the first layer of the hardmask 356 and is isolated from gate metal 324. Additionally, the gate metal 324 and the Schottky contact 325 are electrically isolated from each other. The Schottky metal 325 may be connected to the source metal.

Figure 4:
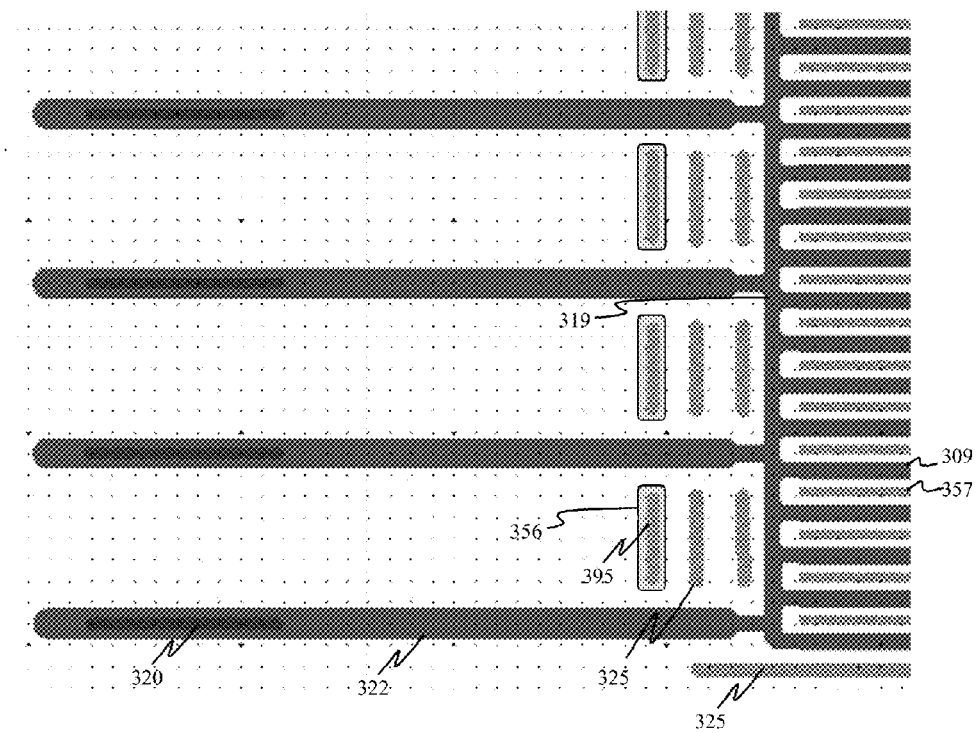
FIG. 4 is an overhead layout pattern of a MOSFET device according to aspects of the present disclosure.

FIG. 4 is a diagram of the layout for a device structure 300. The layout shows the gate electrodes 309 alternating with source contacts 357 in a device region. The source contacts 357 extend perpendicular to the plane of the drawing to make electrical contact with the source metal 317. Gate runners 319 electrically connect to the gate electrodes 309 to gate pickups 322. The gate electrodes, gate runners and gate pickups may be made from the same material, e.g., polysilicon, which may be formed in corresponding trenches in a common step. Gate contacts 321 extend perpendicular to the plane of the drawing to make electrical contact with the gate metal 324 (not shown). The gate metal 324 may be initially formed as part of the same metal layer as the source metal 317. The gate metal 324 may be electrically isolated from the source metal 317 and/or Schottky metal 325, e.g., by forming a common metal layer followed by subsequent masking, etching and dielectric fill processes, as are commonly done for this purpose.

The BCL regions may be placed outside the active device region, which can be seen from the locations of Schottky contacts 325 in FIG. 4. Additionally, ESD structures 395 may be formed outside of the active device region. The ESD structures 395 may be formed over an insulator, such as the first layer 356.

Aspects of the present disclosure describe methods for fabricating the devices descried in FIG. 3A-3F. Methods of fabrication are described in conjunction with FIGS. 5A-5J which depict cross sectional views of a device structure 500 at different stages of fabrication.

Figure 5A:
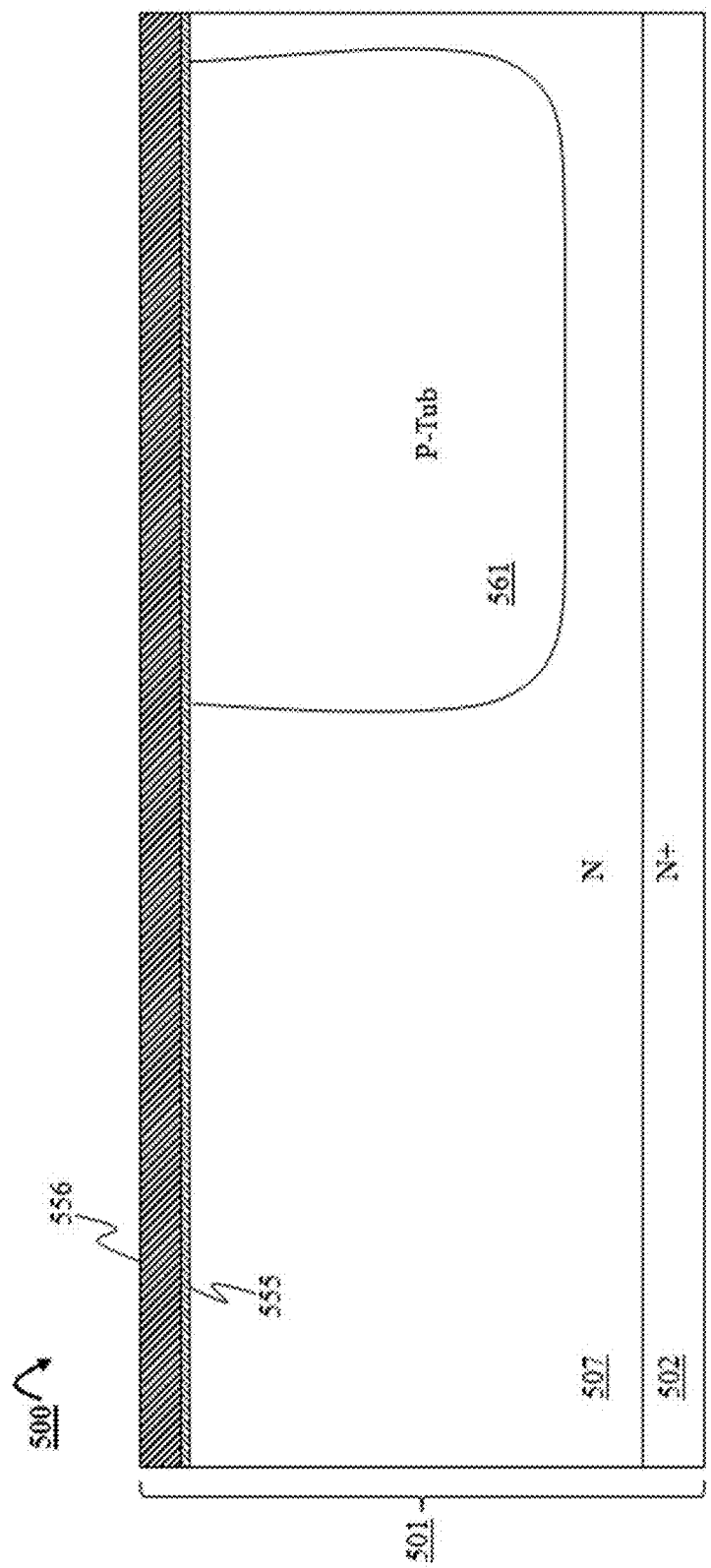
FIGS. 5A-5J are cross-sectional diagrams that describe a method for fabricating a MOSFET device according to aspects of the present disclosure.

FIG. 5A depicts a region of a semiconductor substrate 501. The region of the substrate 501 may be suitably doped to be an N-type or a P-type substrate. For purposes of illustration, the semiconductor substrate 501 used herein will be an N-type substrate. The semiconductor region 501 may comprise a heavily doped substrate region for drain contact 502 with a lightly doped epitaxial region 507 grown above the drain contact region 502. A heavily doped P-tub 561 may be formed in the epitaxial layer 507. The P-tub may be formed by ion implantation or any other suitable method. By way of example, and not by way of limitation, a P-tub mask may be used with a masked implantation of P-type dopants. A hard mask having a first insulating layer 556 and a second insulating layer 555 may be formed on a top surface of the semiconductor substrate 501. The second insulating layer 555 may be resistant to a first etching process that etches the first insulating layer 556, and the first insulating layer 556 may be resistant to a second etching process that etches the second insulating layer 555. By way of example, and not by way of limitation, the first insulating layer 556 may be a nitride layer and the second insulating layer may be an oxide. By way of example, the first insulating layer 556 may be between 0.2 microns (µm) and 0.5 µm thick, and the second insulating layer 555 may be between 50 angstroms (Å) and 250 Å thick.

Figure 5B:
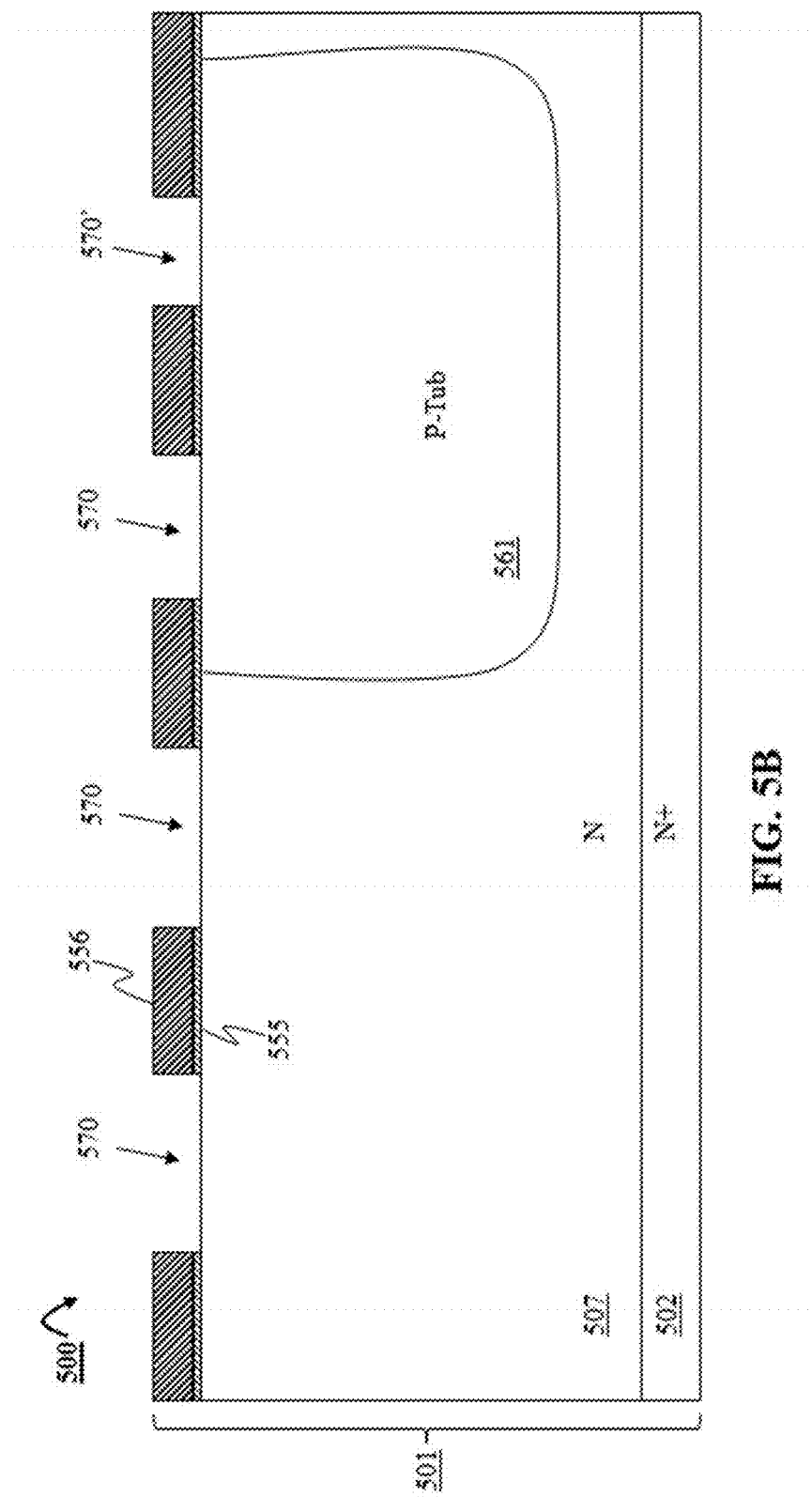
Figure 5C:
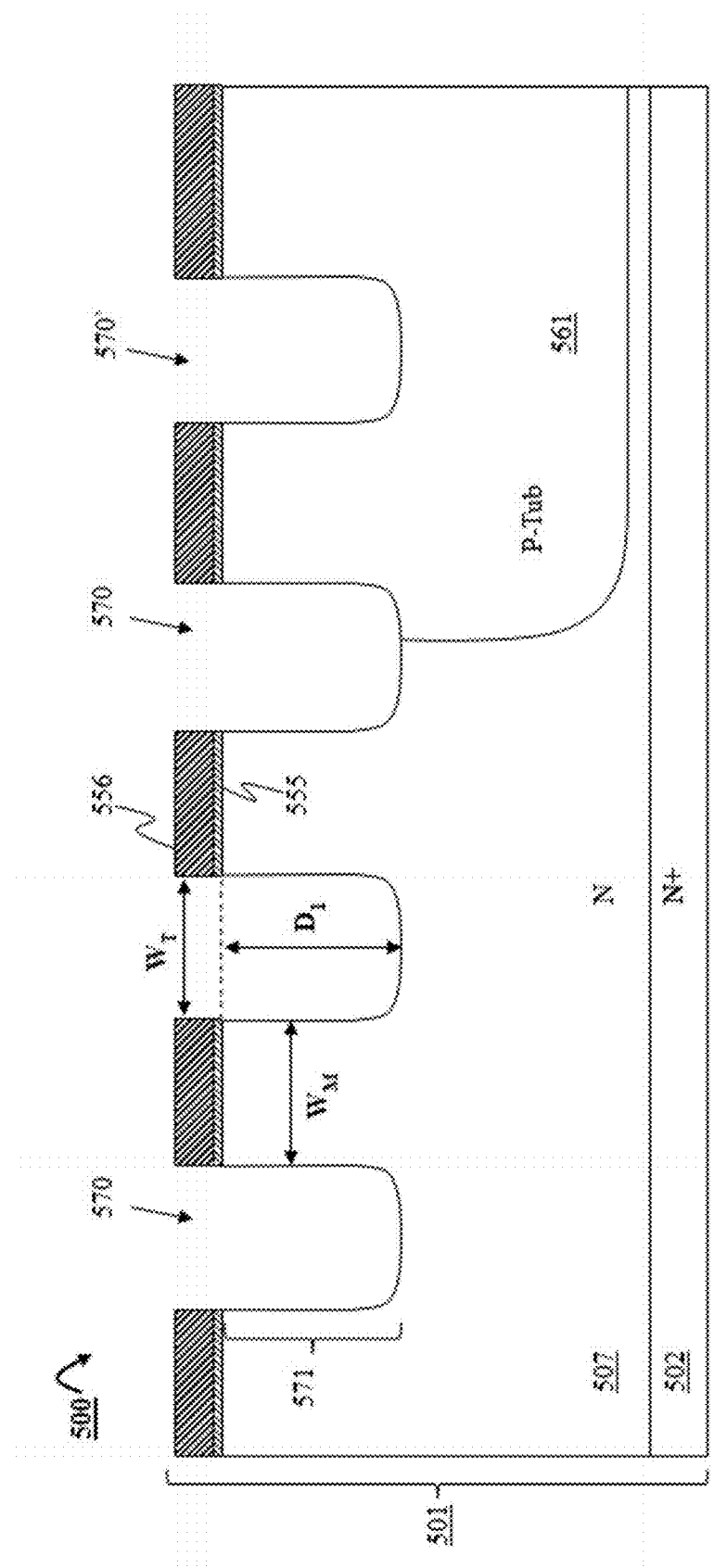

In FIG. 5B a trench mask may be utilized to define the locations of the trenches 570 by etching through the first and second insulative layers of the hardmask 556, 555. Additionally, the gate pickup trenches 570' may also be defined in the same processing step. Next, in FIG. 5C a partial trench etch is utilized to form the upper portion 571 of the trenches 570 and 570'. The upper portion of the trench 571 may be approximately half of the total depth of the trench 570. By way of example, and not by way of limitation, the depth of the upper portion of the trench $D_1$ may be approximately 0.5 µm deep. Each trench 570, 570' may be spaced apart from other trenches by a mesa with a width $W_M$. By way of example the width $W_M$ may be between 0.2 µm and 0.5 µm. By way of example, the width of each trench $W_T$ may be between 0.2 µm and 0.5 µm.

Figure 5D:
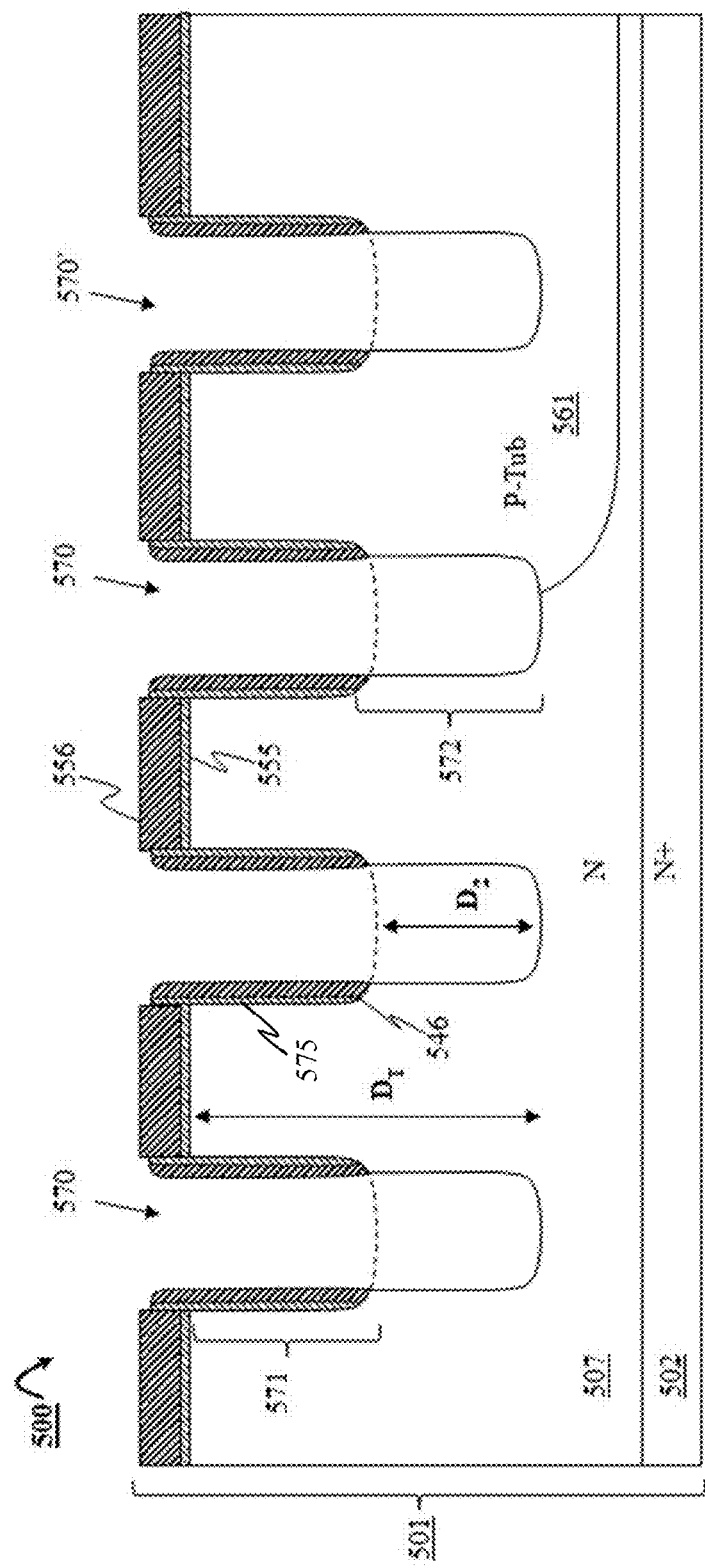

In FIG. 5D the upper portion of the trenches 571 are lined with a thin pad oxide 575 and an insulative spacer 546. The pad oxide 575 and the insulative spacer 546 prevent the upper portion of the trench 571 from growing an oxide during the processing of the lower portion of the trench 572. The insulative spacer 546 also functions as an additional mask layer in order to reduce the width of the lower portion of the trench 572. By way of example, the insulative spacer 546 may be a nitride. After the insulative spacer 546 has been formed, the lower portion of the trench 572 may be formed by an etching process. By way of example, and not by way of limitation, the depth of the second portion of the trench $D_2$ may be an additional 0.5 μm, resulting in a total depth $D_T$ of the trenches 570, 570' being approximately 1.0 μm.

Figure 5E:
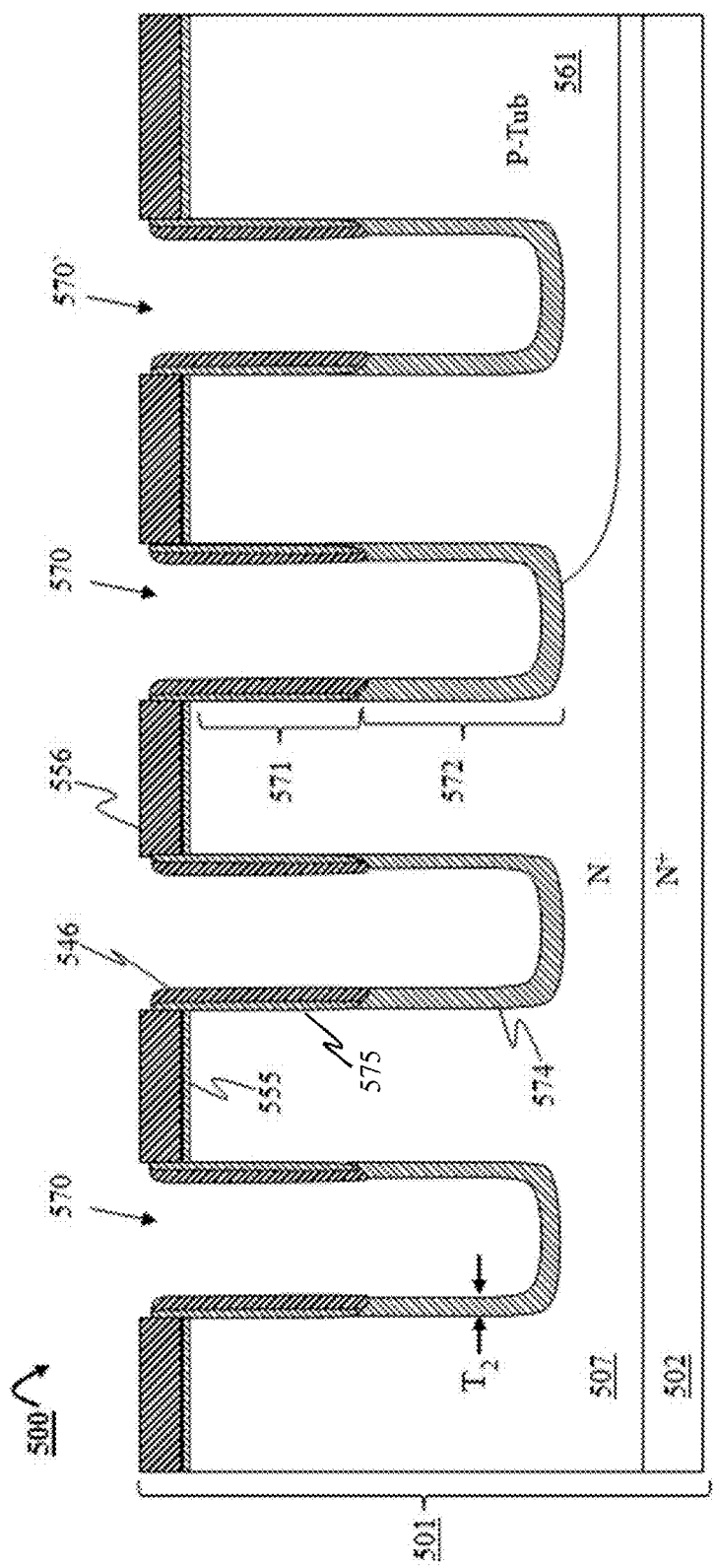
Figure 5F:
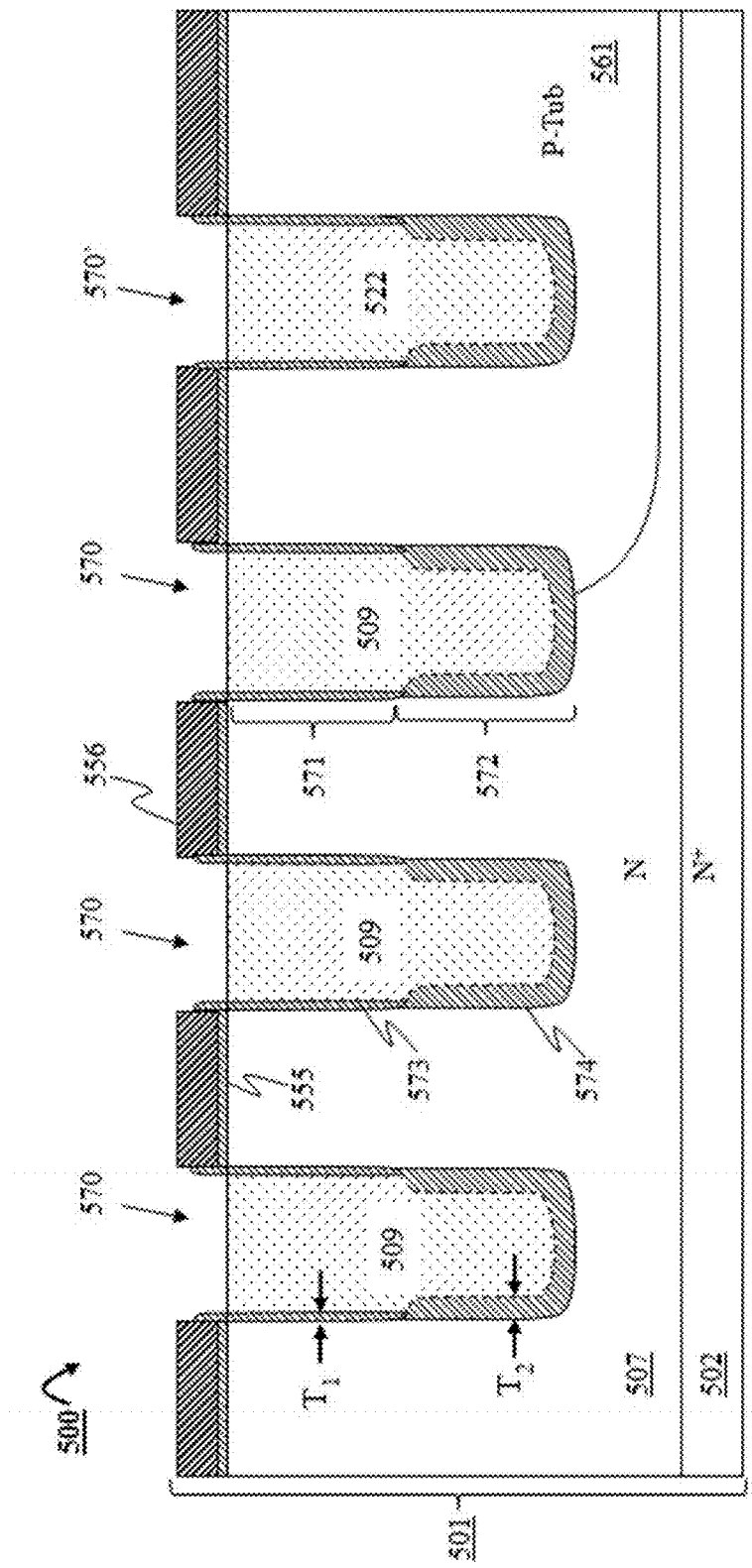

Next, in FIG. 5E a lower insulative layer 574 may be formed. By way of example, and not by way of limitation, the lower insulative layer 574 may be an oxide grown through thermal oxidation. Typically, the thickness $T_2$ may range from 400 Å-1500 Å. In FIG. 5F the pad oxide 575 and the insulative spacers 546 are removed first. Then, the upper insulative layer 573, e.g., is a gate oxide, may be grown. The thickness $T_1$ may range from 50 Å-500 Å. While the ranges for the thicknesses for $T_1$ and $T_2$ slightly overlap, it is desirable for the thickness $T_2$ of the lower insulative portion 574 to be larger than the thickness $T_1$ of the upper insulative layer 573. After the upper insulative layer 573 is grown, the trenches 570 and 570' may be filled with a conductive material in order to form the gate electrode 509 in the active devices and the gate pickup electrode 522 in the gate pickup trench 570'. In order to minimize the possibility of forming voids within the electrodes 509 and 522 the trenches should have an aspect ratio of width to depth no greater than approximately 1:6. By way of example, and not by way of limitation, the conductive material used to form the electrodes 509 and 522 may be a polysilicon doped with N-type dopants. Once the trenches 570 and 570' are filled, the conductive material may be etched down in order to be substantially planar with the top surface of the semiconductor substrate 501.

Figure 5G:
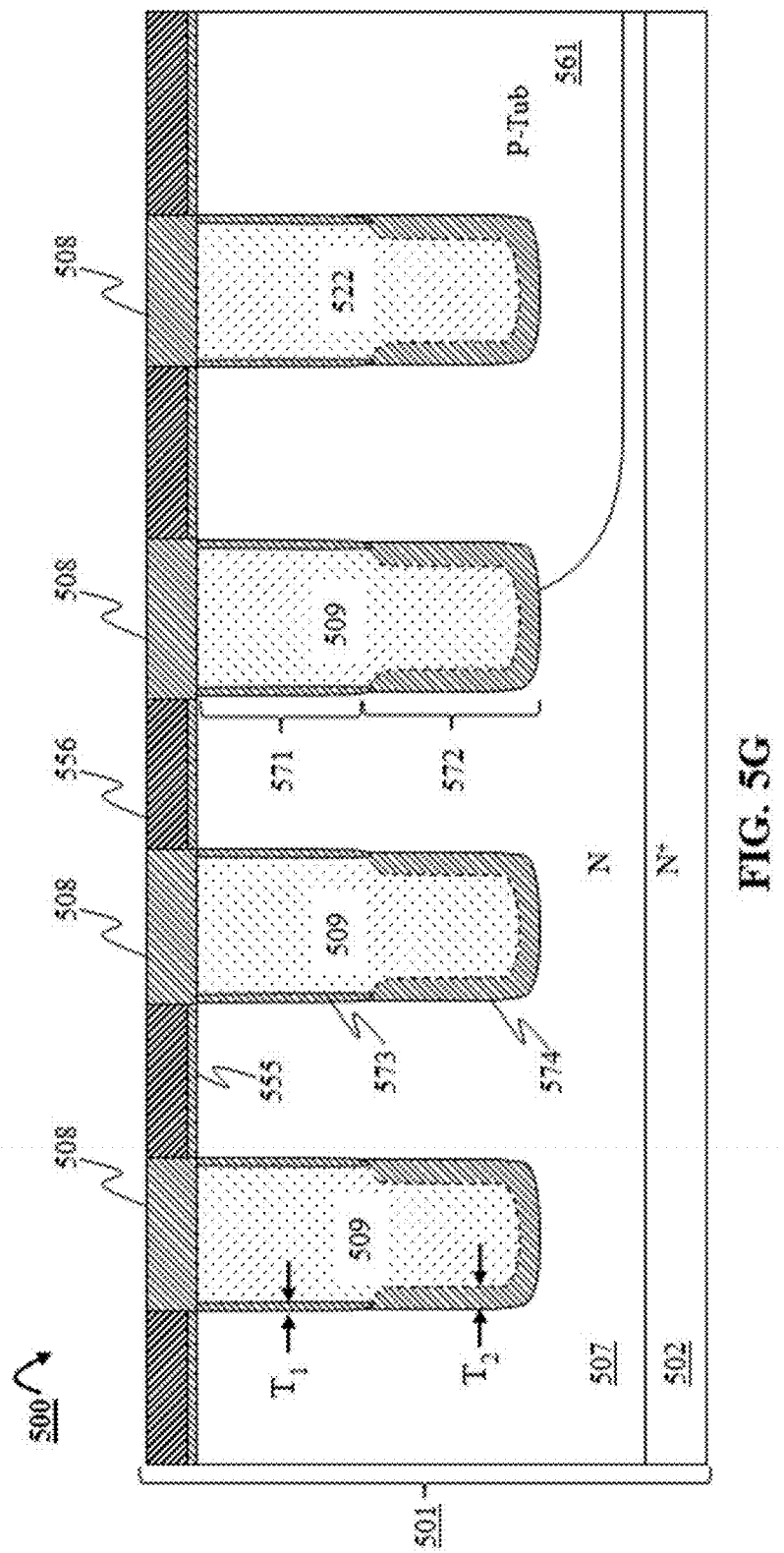

In FIG. 5G, the insulative gate caps 508 are formed. The insulative gate caps may be formed with a deposited oxide, such as but not limited, to borophosphosilicate glass (BPSG) or tetraethylorthosilicate (TEOS). After the insulative gate caps 508 have been deposited, they may be planarized with the top surface of the first layer of the hardmask 556. By way of example, the planarization may be done with chemical mechanical planarization (CMP). Gate caps 508 are self-aligned due to the presence of the first and second layers of the hardmask 556 and 555 that were originally etched to form the trench masks. Without the need for an additional mask aligning step, the alignment of the gate caps 508 is improved. Further, the self-alignment of gate caps 508 provides the foundation for the self-aligning source contacts. Therefore, it is critical that the gate caps 508 be properly aligned.

After the caps 508 have been formed, device 500 may have the first layer of the hardmask 556 removed in the active area with a masking and a first etching process. The first etching process may selectively remove the first layer of the hardmask 556 with little effect on the second layer of the hardmask 555. By way of example, if the first hardmask layer 556 is a nitride and the second hardmask layer 555 is an oxide, then a hot-phosphoric acid wet dip may preferentially remove the nitride while leaving the oxide.

Once the first hardmask layer 556 has been removed, the depletable P-shields 544 and the P-connections 545 may be formed in the epitaxial layer 507. P-type dopants may be implanted into the epitaxial layer with an ion implantation system with a voltage between 700 KeV and 1000 KeV When the P-shield 544 needs to extend directly below the trenches 570, such as when fabricating structures like the orthogonal super-junction device 300''' shown in FIG. 3D, then the P-type dopants may be implanted through the bottom of the trenches 570 before the trenches are lined with the insulative layers 574, 573. According to an alternative aspect of the present disclosure, the P-shields 544 and P-connections 545 may be grown as part of the epitaxial layer 507. According to this aspect of the present disclosure, when forming the epitaxial layer 507, a lower portion of the epitaxial layer 507 may be grown as a P-type epitaxial layer. N-type dopants may then be implanted into regions of the lower epitaxial layer that need to be N-type in order to make the N-connections 546. N-type dopants may also be implanted through the bottom of the trenches in order to form the N-type epitaxial regions 507 under the trenches 570, if needed.

The P-body layer 503 and the $N^+$-source regions 504 may also be implanted into a top portion of epitaxial layer 507 after the first hardmask layer 556 has been removed. The implantation of the P-body layer 503 and the $N^+$ source regions 504 may occur before, after, or during the implantation of the P-shield 544. Next, an insulative spacer 541 may be formed along the sidewalls of the gate caps 508 in order to prevent a short circuit between the gate electrodes 509 and the source metal 517. The insulative spacers 541 may be formed by depositing an insulation layer on the exposed surfaces of the device and then etching the insulation layer away with an anisotropic etch. The anisotropic etch will leave a portion of the insulative layer along the sidewalls of the gate caps 508 that functions as the insulative spacer 541. By way of example and not by way of limitation, the anisotropic etch process may be a reactive ion etching (RIE). The insulative spacers 541 should be thick enough to support the full gate rated voltage. By way of example, the spacers may be between 500 Å and 1500 Å thick.

After the oxidization, a polysilicon layer may be disposed along the top surface of the second layer of the hardmask 555, over the exposed surfaces of the insulative spacer 541, and over the top surface of the gate caps 508. The polysilicon layer may be doped with a high concentration of N-type dopants. An anisotropic etch may then be used to remove the polysilicon layer, leaving behind only polysilicon spacers 542 spaced away from the sidewalls of the gate caps 508 by the insulative spacer 541. By way of example and not by way of limitation, the anisotropic etch process may be a reactive ion etching (RIE). The anisotropic etch process may also etch through the second layer of the hardmask 555. Additionally, the polysilicon spacers 542 may be used to form the source regions 504 with a diffusion process instead of the implantation step as described above. The source regions 504 may be formed by diffusing N-type dopants from the polysilicon spacer 542 into the top portion of the epitaxial layer 507 below the spacers 542.

With the top surface of the epitaxial layer 507 exposed, another anisotropic etching process may be used to etch through the epitaxial layer in order to expose the P-body region 503 with the self-aligned contact openings 547. The polysilicon spacers 542 protect the source region 504 underneath and therefore provide source regions 504 with a consistent size across the device 500. In order to provide better ohmic contact with the source metal 517, a high concentration of P-type dopants may be implanted into the surface of the self-aligned contact openings 547 in order to form ohmic contacts 543. By way of example, a boron surface implant may be used to form the ohmic contacts 543.

Figure 5H:
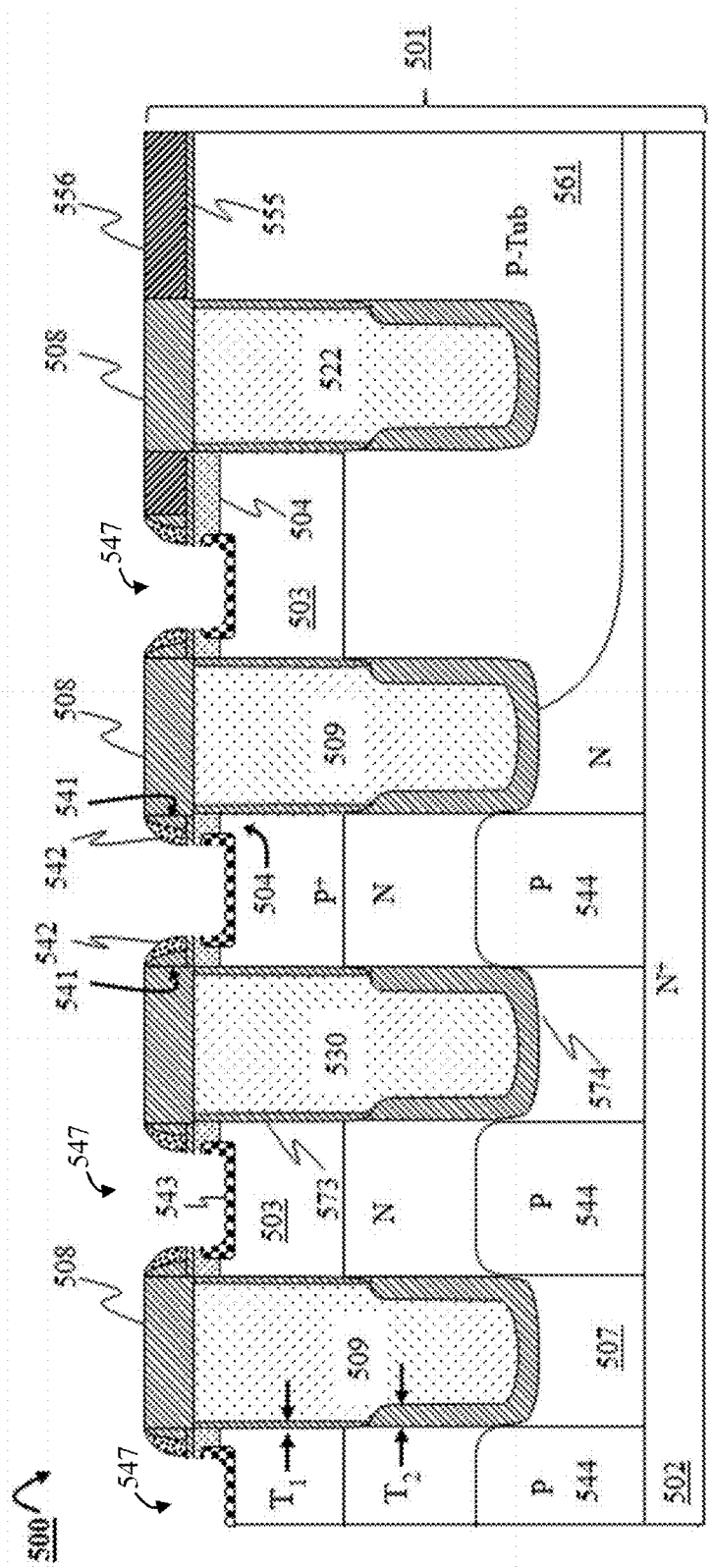
Figure 5H:
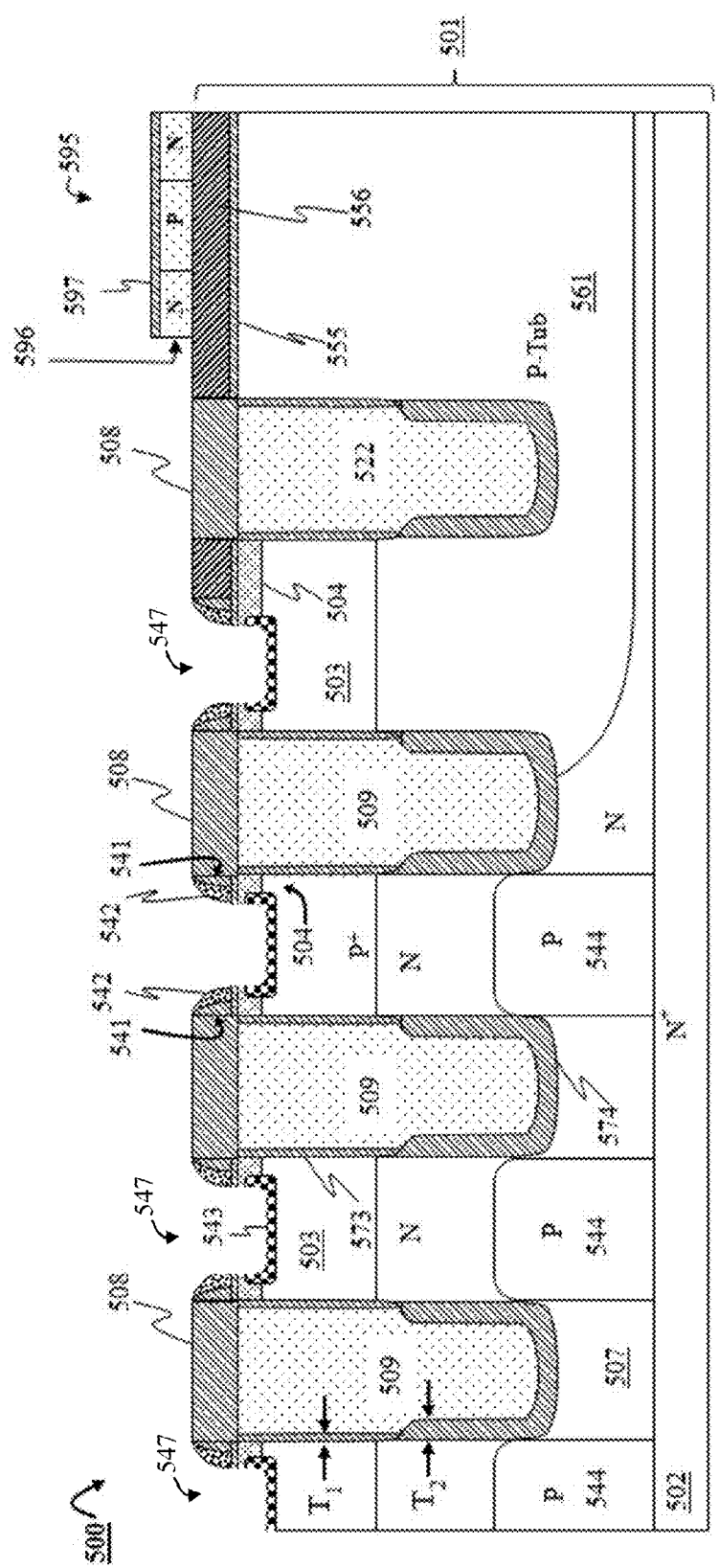

According to additional aspects of the present disclosure, the device 500 may also have an ESD structured 595. FIG. 5H' shows that the structure 595 may be formed before the first hardmask layer 556 is removed from the active region. By way of example, the ESD structure may be formed by first depositing an un-doped polysilicon layer over the top surface of the device 500. A first ESD mask may then be used to selectively dope, with N-type dopants the regions of the polysilicon that will become the ESD diode 596. The P-type portions of the ESD diode 596 may be implanted during the P-body implant. A second ESD mask may then be used to selectively remove the polysilicon layer in order to form the ESD diode 596. An insulative layer 597 may be grown over the ESD diode 596 to protect it from subsequent processing. Thereafter, device 500 may be processed according to the process described by FIG. 5H.

Figure 5I:
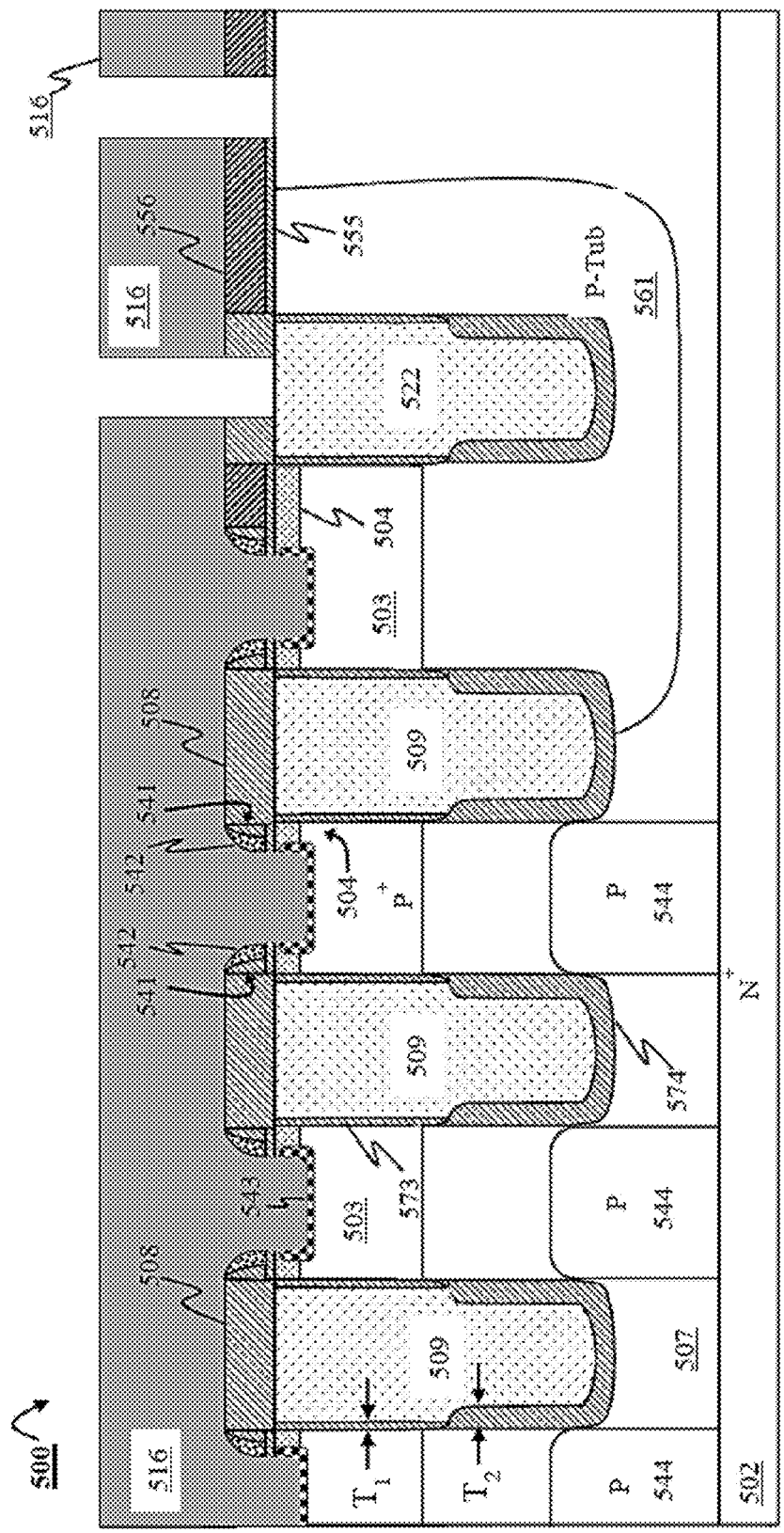
Figure 5J:
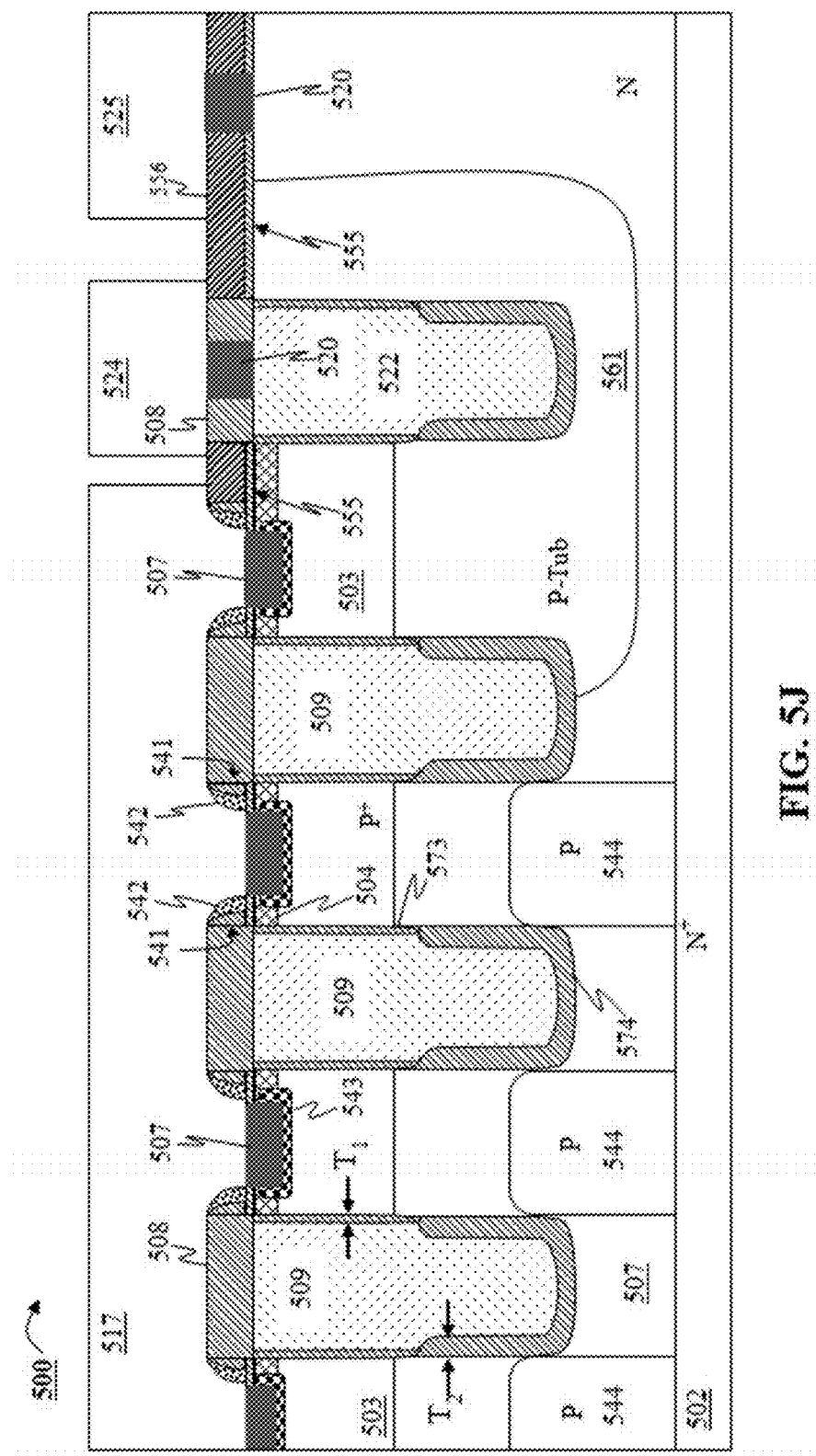

Returning to device 500, the processing continues with standard contact formation procedures. In FIG. 5I a photoresist layer 516 is deposited over the top surface of the device. A gate contact mask may be used to provide an opening through the gate cap over the gate pickup electrode 522. Additionally, the gate contact mask may provide an opening that allows for the first and second hardmask layers 556, 555 to be etched through in a non-active area of the device to form a Schottky contact 520. In FIG. 5J the photoresist layer is removed and the device 500 is prepared for metallization. Source contacts 507 may be formed in the self-aligned contact openings 547. By way of example, and not by way of limitation, the source contacts may be tungsten. Contacts 520 may also be made to connect the gate pickup electrode to a gate metal 524 and to connect the Schottky metal 525 to the substrate 501. By way of example, the contacts 520 may be made of tungsten. Finally a metal layer may be deposited over the top surface of the device. The metal layer may then be etched to form a source metal 517, a gate pickup metal 524 and a Schottky metal 525 connected to the source metal 517 with the use of a metal definition mask.

Figure 6A:
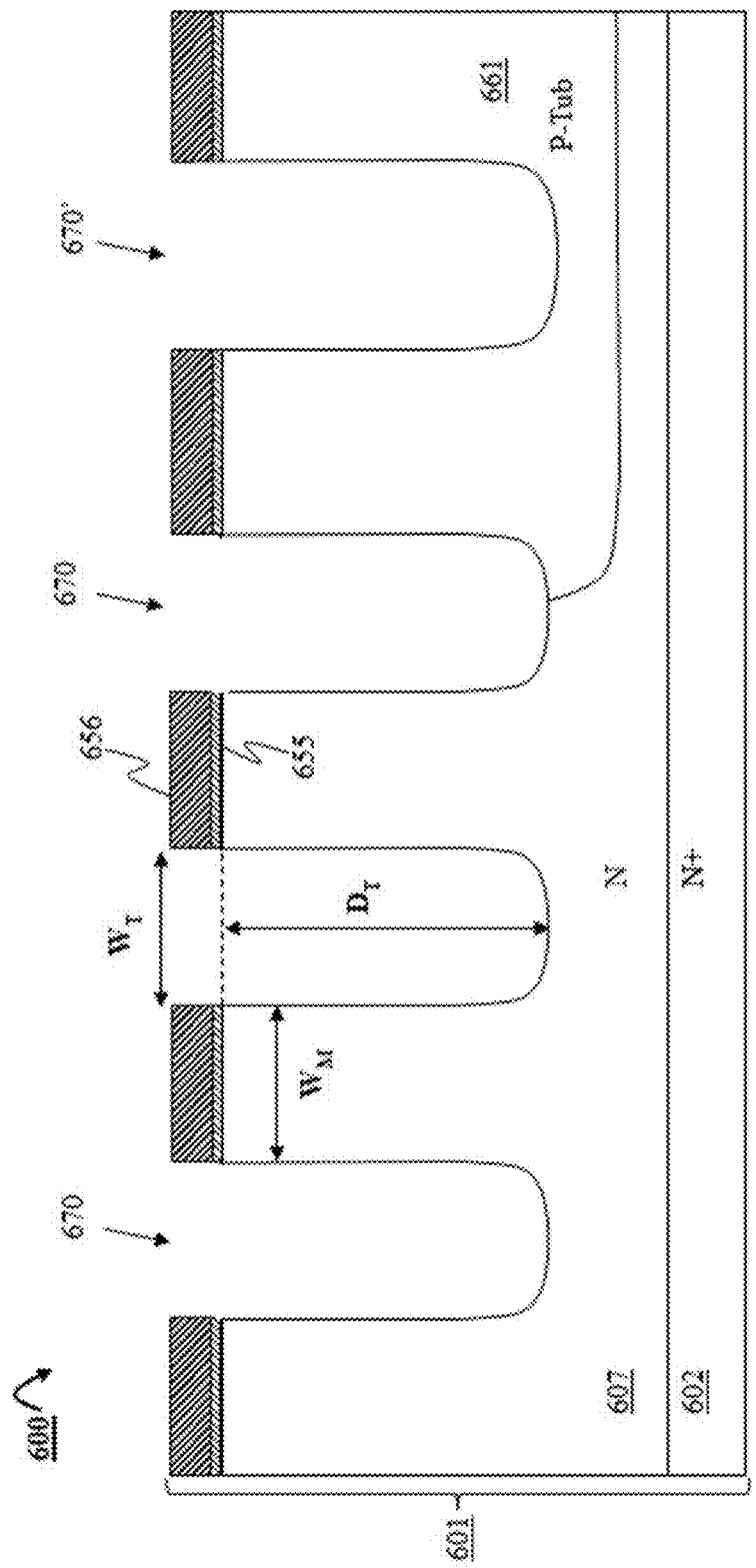
FIGS. 6A-6E are cross-sectional diagrams that describe alternate methods for forming a two-step oxide according to aspects of the present disclosure.

Aspects of the present disclosure also describe an additional process for forming a two-step trench oxide layer. First in FIG. 6A an etching process is used to form trenches 670, 670' in the substrate 601 through a hard mask having a first insulating layer 656 and a second insulating layer 655 formed on a top surface of the semiconductor substrate 601. Substrate 601 may comprise a heavily doped N+ drain region 602 and an epitaxial layer 607. Trenches 770 and trenches 770' are substantially similar. Trenches 770 may be used for active MOSFET structures, and be located in an active region of the device 700. Trenches 770' may be used for gate pickup structures and may be located in non-active regions of the device. As shown, trence 770' is formed in a P-tub 761. The trenches 670, 670' are formed to a depth $D_T$ and width $W_T$. By way of example, the depth $D_T$ may be approximately 1.0 micron and the width of the trench $W_T$ may be between approximately 0.2 μm and 0.5 μm. The trenches may be spaced apart from each other by a mesa that has a width $W_M$ ranging from approximately 0.2 μm-0.5 μm.

Figure 6B:
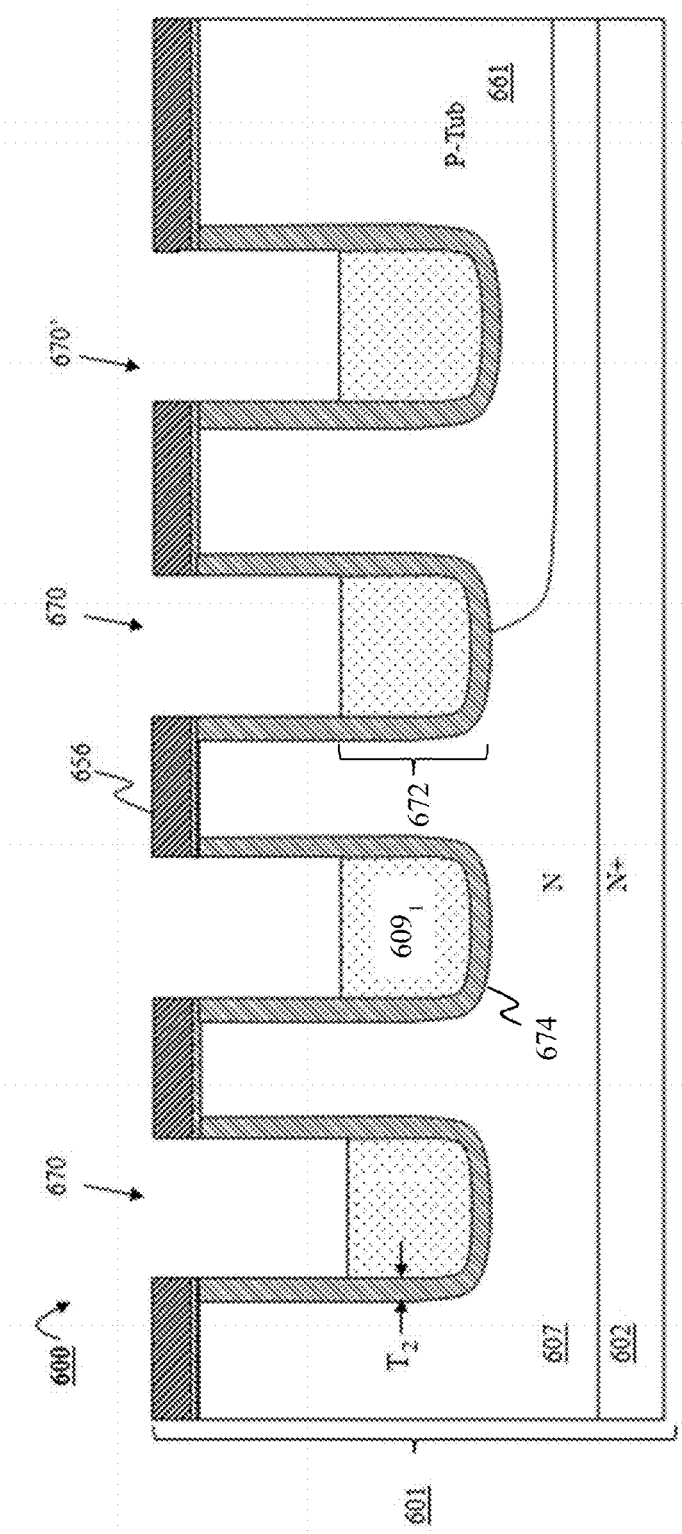

After the trenches 670, 670' have been made, an insulation layer 674 may be formed along the walls and the bottom surface of the trench, as shown in FIG. 6B. The insulation layer 674 may have a thickness $T_2$. By way of example, and not by way of limitation, the thickness $T_2$ may be between 400 Å and 1500 Å. Next the trenches 670, 670' may be filled with a first portion of the conductive material $609_1$. The conductive material $609_1$ may be etched back down such that it only fills the lower portion of the trench 672.

Figure 6C:
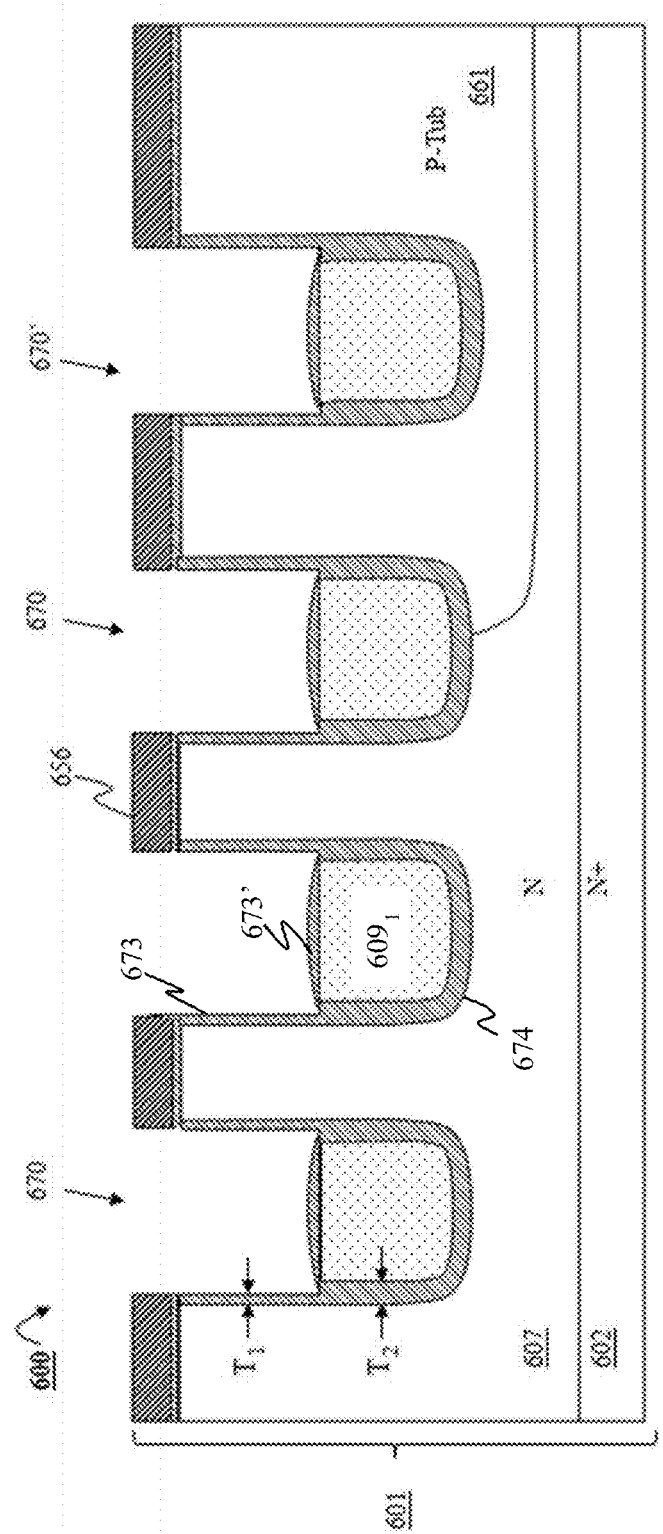

In FIG. 6C the insulation layer 674 in the upper portion of the trench 671 may be etched away. The insulation layer 674 in the lower portion of the trench 672 will be protected from the etching process by the first portion of the conductive material $609_1$. Then the upper insulation layer 673 may be grown on the walls of the upper portion of the trench 671. The upper insulation layer 673 may have a thickness $T_1$. By way of example, and not by way of limitation, the thickness $T_1$ may be between approximately 50 Å and 500 Å. Further, it should be noted that even though the approximate ranges of the thicknesses $T_1$ and $T_2$ overlap, it is desirable that $T_2$ should remain larger than $T_1$. During the growth of the upper insulation layer 673, an insulation layer 673' may also form over the top surface of the first portion of the conductive material $609_1$. A layer of insulation between portions of the conductive material 609 would cause the gate electrode to have a bottom portion that was not at the gate potential. However, simply etching away the unwanted insulation layer 673' may damage the upper insulation layer 673.

Figure 6D:
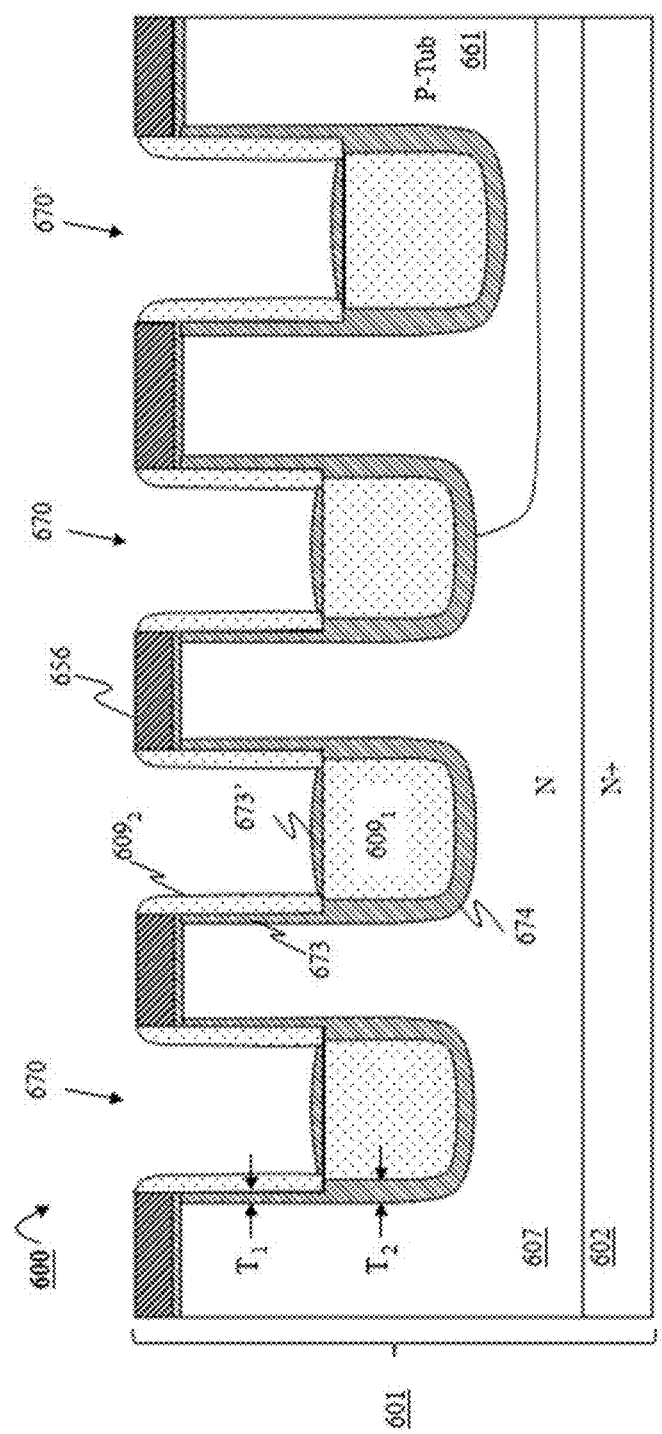
Figure 6E:
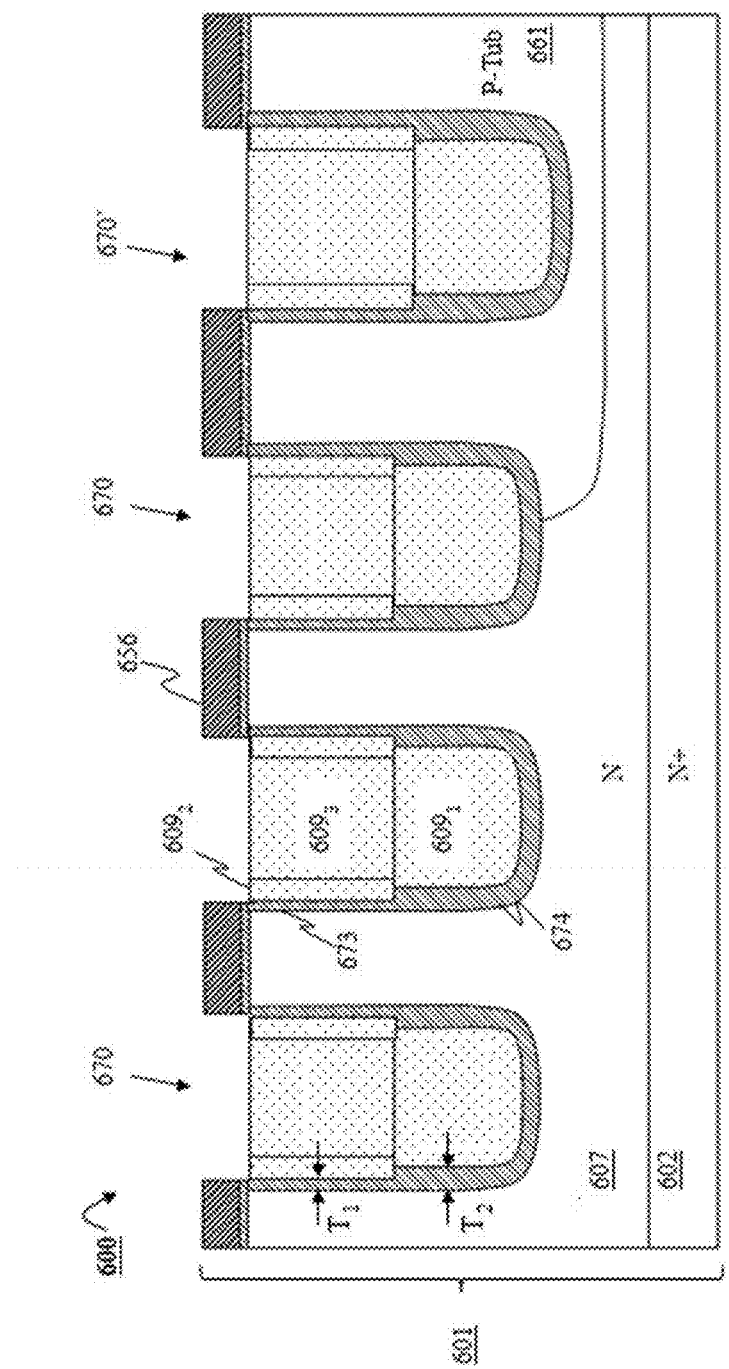

Therefore, in FIG. 6D a second portion of conductive material $609_2$ may be used to fill the trench 670. An anisotropic etching process may then be used to partially remove the second portion of the conductive material $609_2$ leaving only sidewall spacers that protect the upper insulation layer 673 from subsequent etching processes. Next, the unwanted insulation layer 673' may be removed with a suitable etching process. Once removed, the remainder of the trench 770 may be filled with a third portion of the conductive material $609_3$. Thereafter, the processing may continue according to the same processing as device 500.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A MOSFET device, comprising:
   a semiconductor substrate of a first conductivity type wherein the substrate includes a lightly doped epitaxial region in a top portion of the substrate;
   a body region of a second conductivity type formed in a top portion of the semiconductor substrate, wherein the second conductivity type is opposite the first conductivity type;
   a plurality of active device structures formed from the semiconductor substrate and body region, wherein each active device structure comprises a gate electrode formed in a trench and insulated with a gate oxide, wherein an upper portion of the gate oxide is a thickness $T_1$ and a bottom portion of the gate oxide is a thickness $T_2$, wherein $T_2$ is greater than $T_1$; a depletable shield of the second conductivity type formed in the semiconductor substrate at a depth at least partially below a bottom surface of one or more trenches, wherein the depletable shield is electrically connected to the body region; an insulative gate cap formed over each gate electrode, wherein an insulating spacer is formed on the sidewalls of the gate cap and a conductive or semiconductor spacer is formed on the exposed side walls of the insulating spacer, an insulative layer over a top surface of the body region; a conductive source metal layer formed over the insulative layer; one or more electrical connections that connect the source metal layer with one or more source regions, wherein the one or more electrical connections are spaced apart from the gate cap by the insulative spacers.

2. The device of claim 1, wherein one or more of the depletable shields extend through the substrate to a drain contact of the first conductivity type formed in a bottom portion of the substrate.

3. The device of claim 1, wherein one or more of the depletable shields are formed completely below the bottom surface of the trenches.

4. The device of claim 1, wherein the connection between the depletable shield and the body layer is made in a primary plane of the device.

5. The device of claim 1, wherein the connection between the depletable shield and the body layer is made in a secondary plane of the device, wherein the secondary plane of the device is orthogonal to the primary plane of the device.

6. The device of claim 5, wherein a portion of the depletable shield is disconnected from the body layer, wherein a disconnected potion of the depletable shield is spaced apart from a connected portion of the depletable shield by a portion of the substrate configured to connect an epitaxial region of the first conductivity type formed proximate to the trenches to a drain contact of the first conductivity type formed in a bottom portion of the substrate.

7. The device of claim 6, wherein the disconnected portion of the depletable shield continuously extends below two or more trenches in the primary plane and is configured to form an orthogonal super-junction structure with the portion of the substrate configured to connect the epitaxial region to the drain contact.

8. The MOSFET device of claim 1, wherein the conductive or semiconductor spacer is a polysilicon spacer.

9. The MOSFET device of claim 8, wherein the polysilicon spacer is doped with dopants of the first conductivity type.

10. The MOSFET device of claim 9, further comprising: a plurality of source regions of the first conductivity type formed in a top portion of the semiconductor substrate proximate to the plurality of trenches.

11. The MOSFET device of claim 1, further comprising one or more electrostatic discharge (ESD) protection features.

12. The MOSFET device of claim 1, further comprising one or more gate pickup trenches.

13. The MOSFET device of claim 1, further comprising a Schottky contact.

14. The MOSFET device of claim 13, wherein the Schottky contact further comprises a body clamp structure.

* * * * *